United States Patent
Suzuki

(10) Patent No.: US 7,061,655 B2
(45) Date of Patent: Jun. 13, 2006

(54) PROVISION OF BRIGHT AND HIGH QUALITY IMAGE FROM CCD IMAGE PICK-UP DEVICE

(75) Inventor: Nobuo Suzuki, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 911 days.

(21) Appl. No.: 10/160,106

(22) Filed: Jun. 4, 2002

(65) Prior Publication Data

US 2003/0002094 A1    Jan. 2, 2003

(30) Foreign Application Priority Data

Jun. 21, 2001    (JP) .............................. 2001-187754

(51) Int. Cl.
*H04N 1/46* (2006.01)

(52) U.S. Cl. ...................... 358/513; 358/514; 348/220; 11/317

(58) Field of Classification Search ................ 358/513, 358/514, 482, 483, 505, 512, 515; 348/220, 348/317
See application file for complete search history.

(56) References Cited

U.S. PATENT DOCUMENTS

| 6,011,583 | A | * | 1/2000 | Hieda et al. | ............. 348/220.1 |
|---|---|---|---|---|---|
| 6,469,290 | B1 | * | 10/2002 | Suzuki | ..................... 250/208.1 |
| 6,538,696 | B1 | * | 3/2003 | Hieda et al. | ................. 348/317 |
| 6,847,397 | B1 | * | 1/2005 | Osada | ......................... 348/273 |
| 6,933,970 | B1 | * | 8/2005 | Koshiba et al. | ............. 348/273 |
| 2002/0027604 | A1 | * | 3/2002 | Hung | ......................... 348/239 |
| 2002/0033887 | A1 | * | 3/2002 | Hieda et al. | ................. 348/220 |
| 2006/0007504 | A1 | * | 1/2006 | Inaba et al. | ................. 358/463 |

* cited by examiner

*Primary Examiner*—Kimberly Williams
*Assistant Examiner*—Negussie Worku
(74) *Attorney, Agent, or Firm*—Arent Fox PLLC.

(57) ABSTRACT

In an image pick-up apparatus having an alternate repetitive configuration of a pixel row having green and magenta pixels alternately and repetitively disposed and a pixel row having cyan and yellow pixels alternately and repetitively disposed, pixel addition is performed for charges accumulated in the green pixel and charges accumulated in the cyan or yellow pixel, and also pixel addition is performed for charges accumulated in the magenta pixel and charges accumulated in the yellow or cyan pixel and generating a signal unit. The roles of the yellow and cyan pixels are exchanged in respective sets of two rows. The solid state image pick-up apparatus having a number of complementary color pixels disposed in a honeycomb configuration is provided which can suppress reduction of a resolution, generation of a false color and reduction of a color S/N ratio even if the sensitivity of the apparatus is increased through pixel addition.

26 Claims, 20 Drawing Sheets

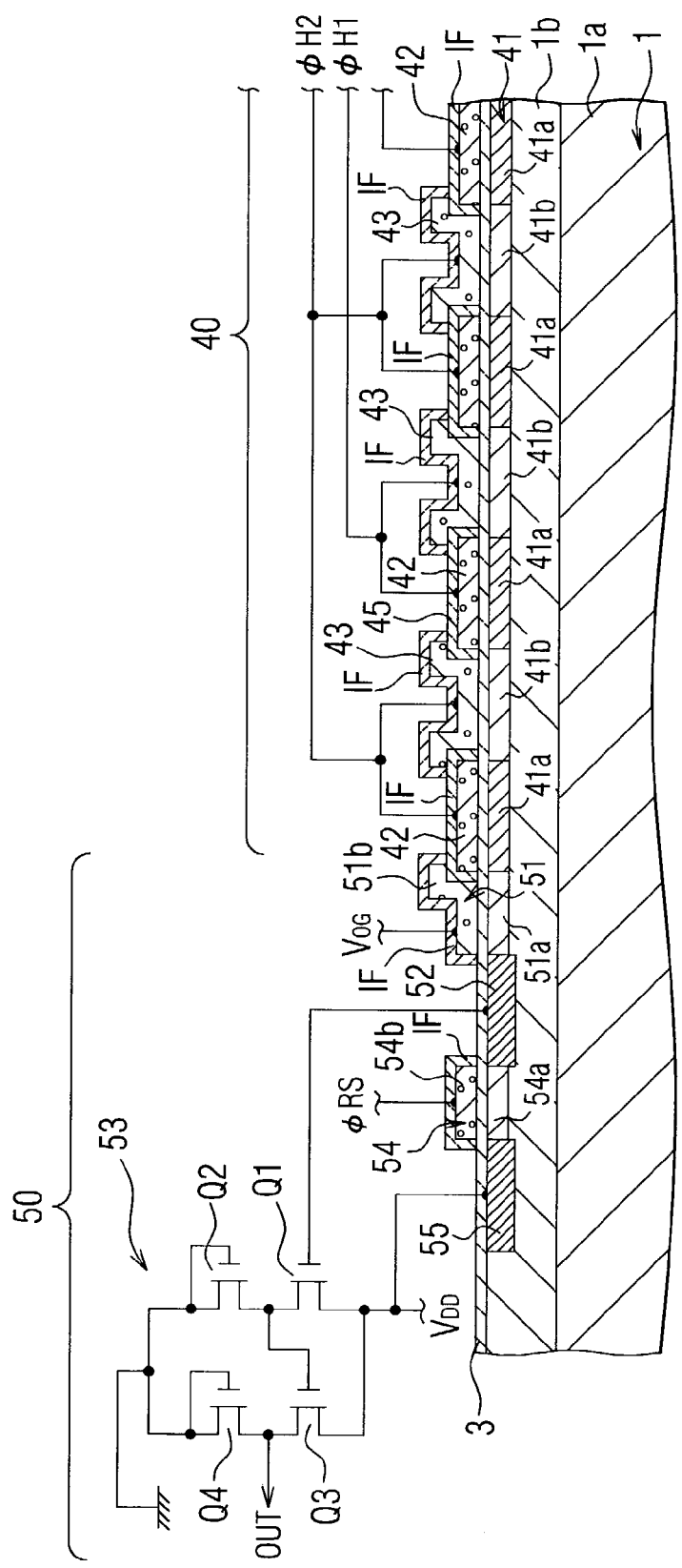

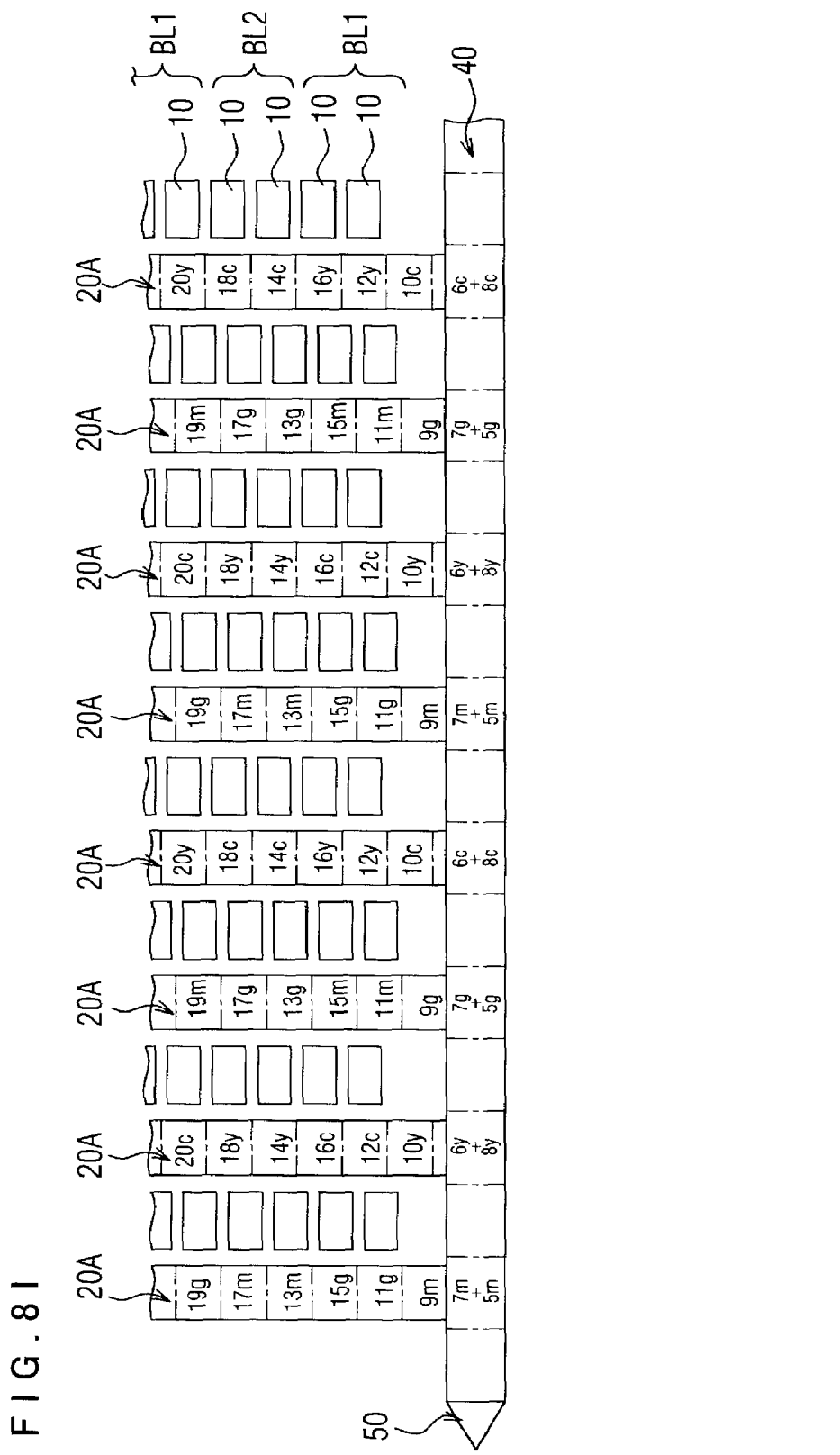

F I G . 9
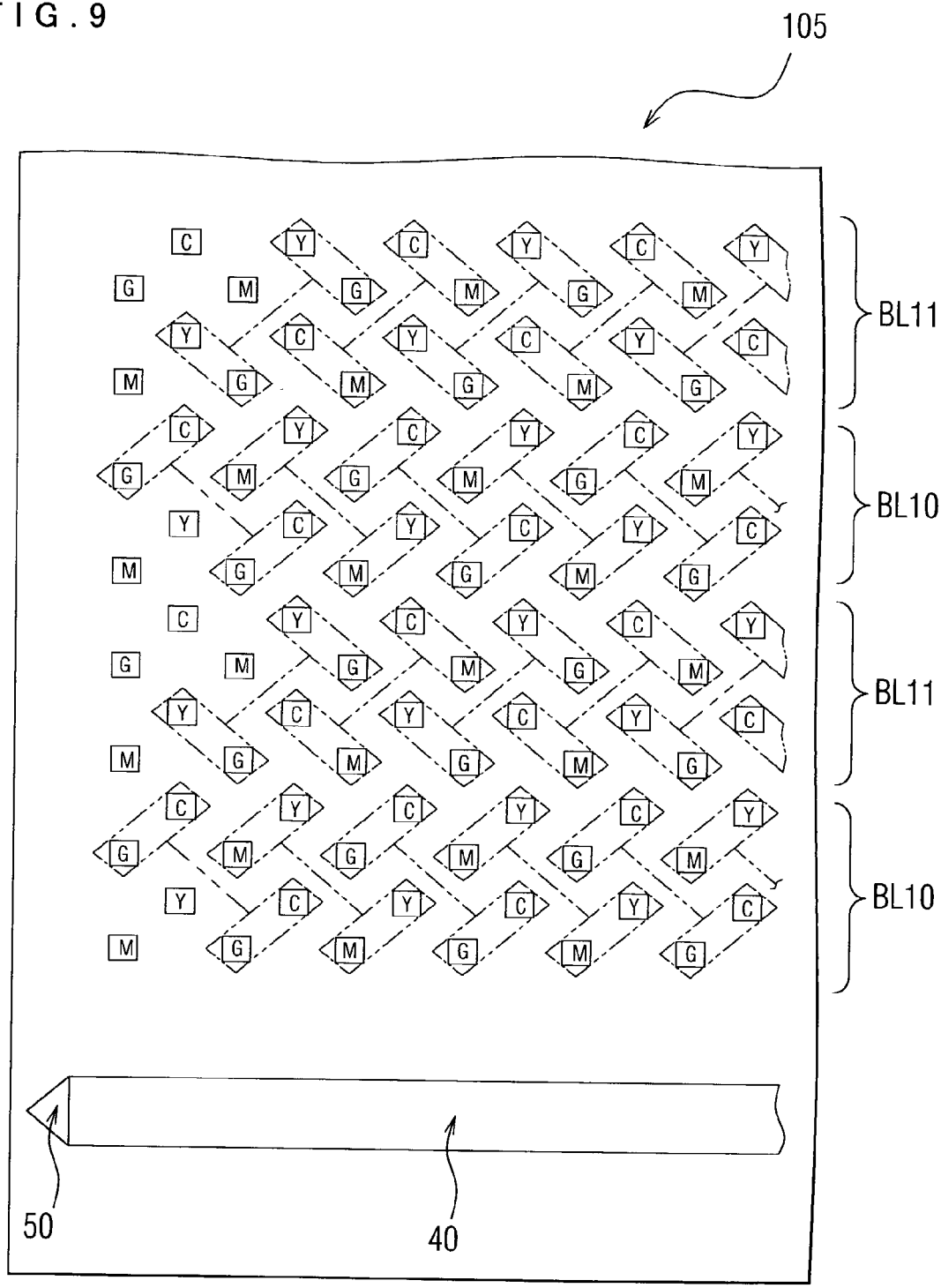

F I G. 12
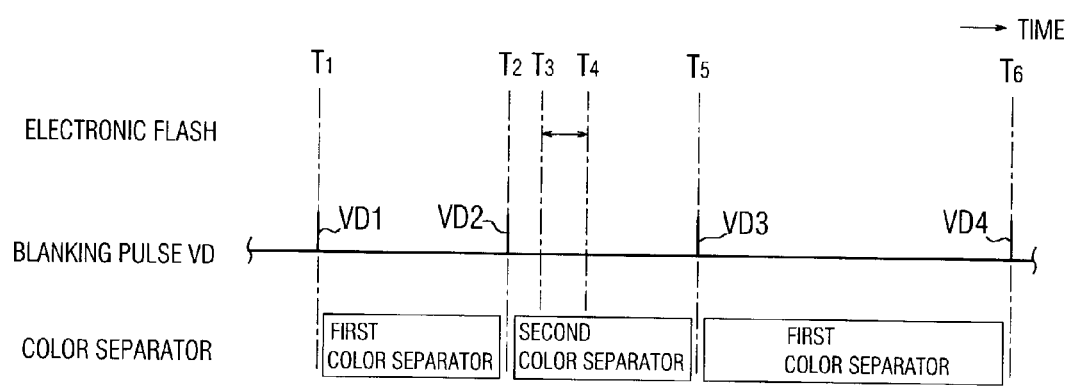

PROVISION OF BRIGHT AND HIGH QUALITY IMAGE FROM CCD IMAGE PICK-UP DEVICE

CROSS REFERENCE TO RELATED APPLICATION

This application is based on Japanese Patent Application No. 2001-187754, filed on Jun. 21, 2001, the entire contents of which are incorporated herein by reference.

BACKGROUND OF THE INVENTION

A) Field of the Invention

The present invention relates to an image pick-up device, and more particularly to an image pick-up device having a number of pixels disposed in a honeycomb configuration.

B) Description of the Related Art

After integration and mass production techniques for charge coupled devices (CCD) have been established, image pick-up apparatuses such as digital still cameras and digital video cameras are rapidly prevailing, these image pick-up apparatuses using CCD type solid state image pick-up devices as area image sensors.

In a CCD type solid state image pick-up device, a number of photoelectric conversion elements (pixels) are disposed in a matrix shape in a plurality of rows and columns on the principal surface of a semiconductor substrate. A vertical CCD (VCCD) made of CCD is disposed along each pixel row. A horizontal CCD (HCCD) made of CCD is disposed connected to each output terminal of these VCCD's.

In a single plate type color CCD solid state image pick-up device, a color filter array is disposed above a number of pixels disposed in a matrix shape. The color filter array is made of color filters disposed above pixels. There are a color filter array of three primary colors and a color filter array of complementary colors. The color filter array of complementary colors includes an array made of only complementary color filters and an array made of complementary color filters and green color filters. The color filter produces the color of a pixel. If necessary, micro lenses are disposed on color filters.

As light becomes incident upon a pixel, charges corresponding in amount to the incident light are accumulated in the pixel. Charges accumulated in each pixel are read to VCCD and transferred to HCCD via VCCD's. Charges accumulated in pixels of one pixel row are read at the same timing into corresponding VCCD's and transferred at the same timing to the HCCD. HCCD sequentially transfers charges received from VCCD's toward an output terminal.

Charges output from HCCD are detected by an output circuit. The output circuit generates a voltage signal corresponding to the detected charges, amplifies the voltage signal and outputs it. The charges detected by the output circuit are drained, for example, to the drain region and then absorbed in a supply voltage. An image pick-up apparatus utilizing a CCD solid state type image pick-up device generates an image signal from the voltage signal (pixel signal: signal unit) output from the output circuit.

A conventional CCD solid state image pick-up device utilized as an area image sensor has a number of pixels disposed in a square matrix shape (or a matrix shape having different numbers of rows and columns).

Many recent CCD solid state image pick-up devices of high resolution and sensitivity have a honeycomb configuration which is easy to dispose pixels at a high integration and with a broader light reception area.

The term "honeycomb configuration" used in this specification means a configuration comprising a first lattice in a two-dimensional tetragonal matrix configuration and a second lattice having its lattice points at the interstitial position of the first lattice. For example, each pixel in an even pixel column (row) is shifted by about a half of the pitch of pixels in the column (row) direction from each pixel in an odd pixel column (row), and each pixel column (row) includes only pixels in odd rows (columns) or even rows (columns). The honeycomb configuration is one type of the configuration that a number of pixels are disposed in a matrix shape in a plurality of rows and columns.

The term "about a half" of the pitch is intended to include just a half and another value considered as substantially equal to a half from the CCD image sensor performance and image quality although this value is not correctly a half because of manufacture errors and pixel position rounding errors caused by design or mask.

If a subject is too dark, a sufficient image pick-up sensitivity cannot be obtained. If the subject is at a near position, a sufficient image pick-up sensitivity can be obtained by utilizing an electronic flash such as a strobe. However, if the subject is at a far position, a sufficient image pick-up sensitivity cannot be obtained even if an electronic flash is utilized.

The sensitivity of an image pick-up device can be increased by adding charges read from a plurality of pixels before amplification. In this specification, adding charges read from a plurality of pixels is called "pixel addition" where appropriate.

For example, luminance information can be obtained from pixel signals of two red pixels, two blue pixels and three green pixels. Information (color signal information) necessary for generating one color signal can be obtained from pixel signals of one red pixel and two green pixels. Color signal information can also be obtained from pixel signals of one blue pixel and two green pixels.

If the sensitivity of a single plate solid state image pick-up device with a color filter array of three primary colors is increased by pixel addition, the luminance may be lowered so that the resolution lowers, or the color signals may be lowered so that a false color is formed or a color S/N ratio lowers.

The sensitivity and resolution of an image pick-up device having a number of pixels disposed in a square matrix shape can be improved more by using a color filter array of complementary colors than by using a color filter array of three primary colors.

An image pick-up device having a number of complementary color pixels disposed in the honeycomb configuration is still not known which is easy to suppress reduction of a resolution, generation of a false color and reduction of a color S/N ratio even if the sensitivity is increased by pixel addition.

SUMMARY OF THE INVENTION

An object of this invention is to provide an image pick-up device with complementary color pixels disposed in a honeycomb configuration, which device is easy to suppress reduction of a resolution, generation of a false color and reduction of a color S/N ratio when the sensitivity is increased by pixel addition.

Another object of this invention is to provide a method of driving an image pick-up device with complementary color pixels disposed in a honeycomb configuration, which method is easy to suppress reduction of a resolution, generation of a false color and reduction of a color S/N ratio when the sensitivity is increased by pixel addition.

According to one aspect of the present invention, there is provided an image pick-up apparatus comprising: a number of pixels disposed in a honeycomb configuration, and a signal unit generator for reading and detecting charges accumulated in each pixel and generating a signal to be unit used for generating an image signal, wherein: the configuration of the number of pixels includes an alternate repetitive configuration of a pixel row having green and magenta pixels alternately and repetitively disposed and a pixel row having cyan and yellow pixels alternately and repetitively disposed; and the signal unit generator can selectively perform either (i) an individual pixel read operation of individually detecting charges accumulated in each pixel and generating a signal unit or (ii) a pixel addition read operation of detecting charges which are an addition of charges accumulated in the green pixel and charges accumulated in the cyan or yellow pixel and generating a signal unit, and also detecting charges which are an addition of charges accumulated in the magenta pixel and charges accumulated in the yellow or cyan pixel and generating a signal unit.

According to another aspect of the invention, there is provided a driving method for an image pick-up apparatus having a number of pixels disposed in a honeycomb configuration, and a signal unit generator for reading and detecting charges accumulated in each pixel and generating a signal unit to be used for generating an image signal, wherein the configuration of the number of pixels includes an alternate repetitive configuration of a pixel row having green and magenta pixels alternately and repetitively disposed and a pixel row having cyan and yellow pixels alternately and repetitively disposed, the method comprising: a step of applying light to each pixel to accumulate charges in the pixel; and a step of generating the signal unit by the signal unit generator which performs either (i) an individual pixel read operation of individually detecting charges accumulated in each pixel and generating a signal unit or (ii) a pixel addition read operation of detecting charges which are an addition of charges accumulated in the green pixel and charges accumulated in the cyan or yellow pixel and generating a signal unit, and also detecting charges which are an addition of charges accumulated in the magenta pixel and charges accumulated in the yellow or cyan pixel and generating a signal unit.

With pixel addition among a number of green, magenta, cyan and yellow pixels disposed in a honeycomb configuration, a luminance signal can be obtained from two types of signal units continuously and repetitively output from the signal unit generator. It is also possible to make each signal unit output from the signal unit generator contain color signal information. By using the color signal information, the red, green and blue color signals can be generated.

It is easy to obtain many luminance signals (luminance information) and much color signal information even if pixel addition is performed. It is therefore easy to suppress reduction of a resolution, generation of a false color and reduction of a color S/N ratio.

As above, in the image pick-up apparatus having a number of complementary color pixels disposed in a honeycomb configuration, it becomes easy to suppress reduction of a resolution, generation of a false color and reduction of a color S/N ratio even if the sensitivity of the apparatus is increased through pixel addition. An image pick-up apparatus capable of picking up a clear image of a dark scene can be provided.

BRIEF DESCRIPTION OF THE DRAWINGS

FIGS. 4A and 4B are a plan view and a cross sectional view briefly showing pixels, VCCD's, HCCD's and an output circuit of the solid state image pick-up device shown in FIG. 1.

FIGS. 8A to 8I are schematic diagrams showing the operation sequence of four-pixel addition for the combinations of pixels shown in FIG. 7.

FIG. 9 is a schematic diagram showing another example of combinations of pixels which combinations generate no white signal when four-pixel addition is performed by a solid state image pick-up device having the pixel layout shown in FIG. 1.

FIG. 12 is a timing chart illustrating the operation timings of first and second color separators of the image pick-up apparatus shown in FIG. 11 when a still image is picked up by using an electronic flash in an image synthesizing mode.

DESCRIPTION OF THE PREFERRED EMBODIMENTS

Figure 1:
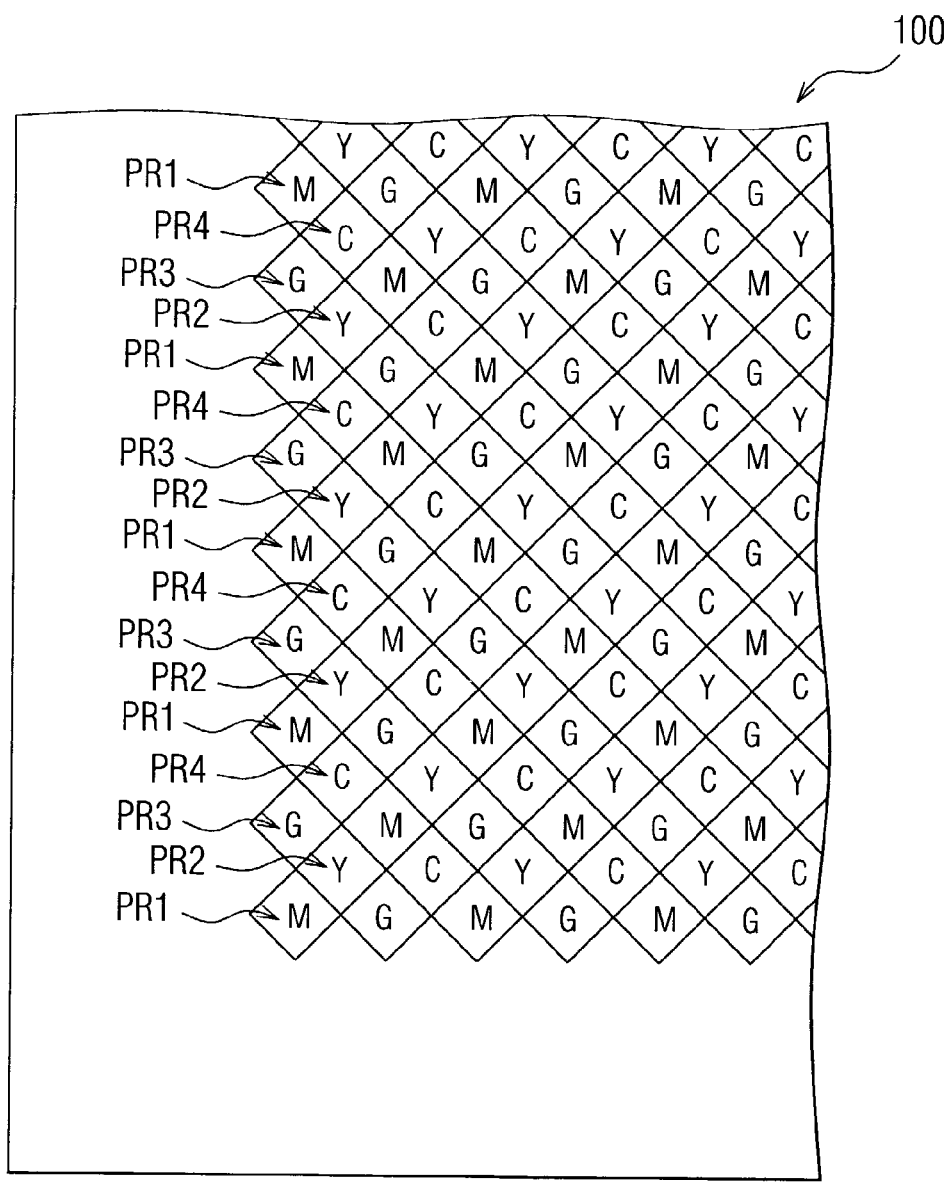
FIG. 1 is a diagram briefly showing the layout of pixels of a solid state image pick-up device according to a first embodiment.

FIG. 1 is a schematic diagram showing the layout of pixels of a solid state image pick-up device. The solid state image pick-up device 100 has a number of green pixels G, magenta pixels M, cyan pixels C and yellow pixels Y.

Each pixel has a photoelectric conversion element and a color filter disposed above the element. FIG. 1 shows the contour of the color filter of each pixel. Characters G, M, C and Y represent the colors of color filters.

The pixel rows can be classified into; a class 1 pixel row PR1 having a magenta pixel M and a green pixel G alternately and repetitively disposed; a class 2 pixel row PR2 having a yellow pixel Y and a cyan pixel C alternately and repetitively disposed; a class 3 pixel row PR3 having a magenta pixel M and a green pixel G alternately and repetitively disposed in the order opposite to the class 1 pixel row PR1; and a class 4 pixel row PR2 having a yellow pixel Y and a cyan pixel C alternately and repetitively disposed in the order opposite to the class 2 pixel row PR2.

The class 1, 2, 3 and 4 pixel rows PR1, PR2, PR3 and PR4 are disposed repetitively in this order from the downstream side (lower side of the drawing sheet of FIG. 1) to the upstream side (upper side of the drawing sheet). In this specification, a motion of charges is simulated to a flow and the relative position of each component is identified by describing it as "at the upstream position of some component", "at the downstream position of some component" or the like, when necessary.

If two-pixel addition of the magenta pixel M and green pixel G is not performed for the solid state image pick-up device 100, it is possible to suppress reduction of a luminance, generation of a false color, and reduction of a color S/N ratio. Charges in a green pixel G are added to charges in a cyan pixel C or yellow pixel Y, and charges in a magenta pixel M are added to charges in a yellow pixel Y or cyan pixel C.

Figure 2A:
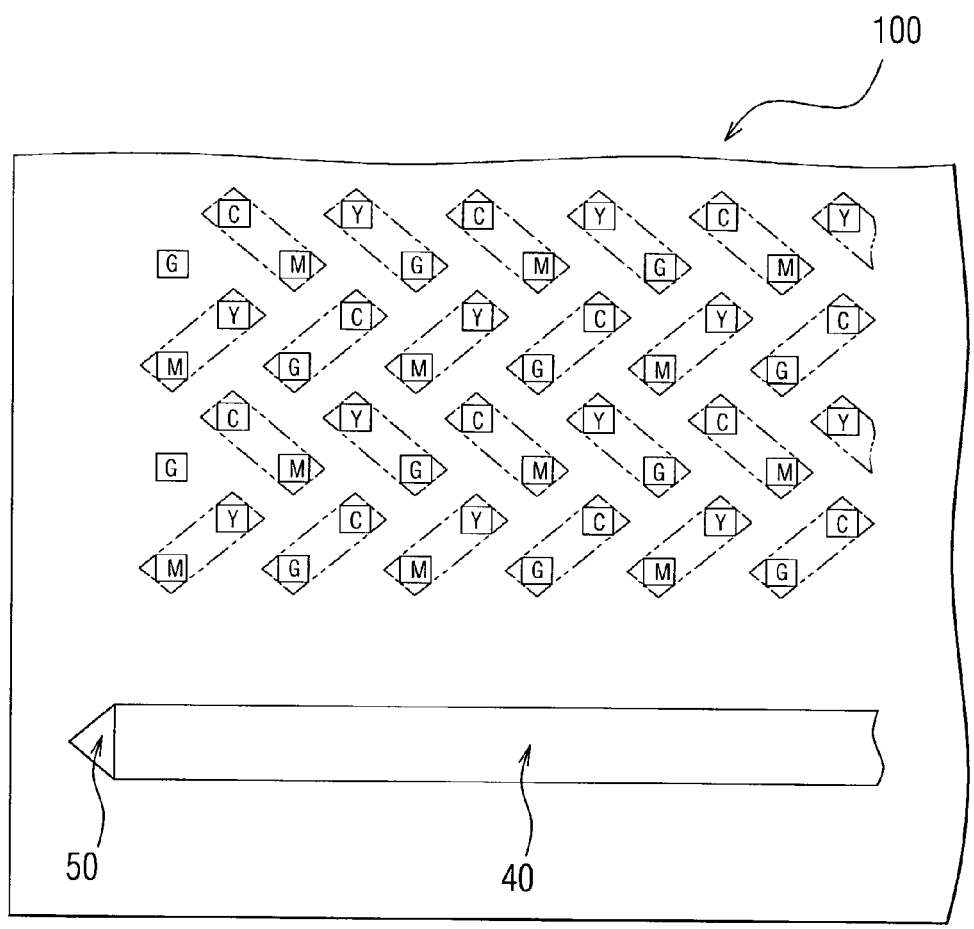
FIGS. 2A and 2B are a schematic diagram showing an example of combinations of pixels subjected to pixel addition by the solid state image pick-up device shown in FIG. 1 which pixel addition generates no white signal, and a schematic diagram showing the layout of pixels of three primary colors.

FIG. 2A shows an example of combinations of pixels for two-pixel addition of the solid state image pick-up device 100, the pixel addition generating no white signal, i.e., the pixel addition of the magenta pixel M and green pixel G.

FIG. 2A also shows HCCD's 40 and output circuit 50 which constitute a signal unit generator. Charges of two pixel rows are supplied from the pixel columns to the HCCD's (HCCD row) 40.

Two pixels surrounded by a two-dot chain line are added. In the class 1 and 2 pixel rows PR1 and PR2 (refer to FIG. 1), the magenta pixel M and yellow pixel Y are added and the green pixel G and cyan pixel C are added. In the class 3 and 4 pixel rows PR3 and PR4 (refer to FIG. 1), the cyan pixel C and magenta pixel M are added and the yellow pixel Y and green pixel G are added.

As well known, magenta is obtained through additive mixture of red and blue, yellow is obtained through additive mixture of red and green, and cyan is obtained through additive mixture of green and blue.

Figure 2B:
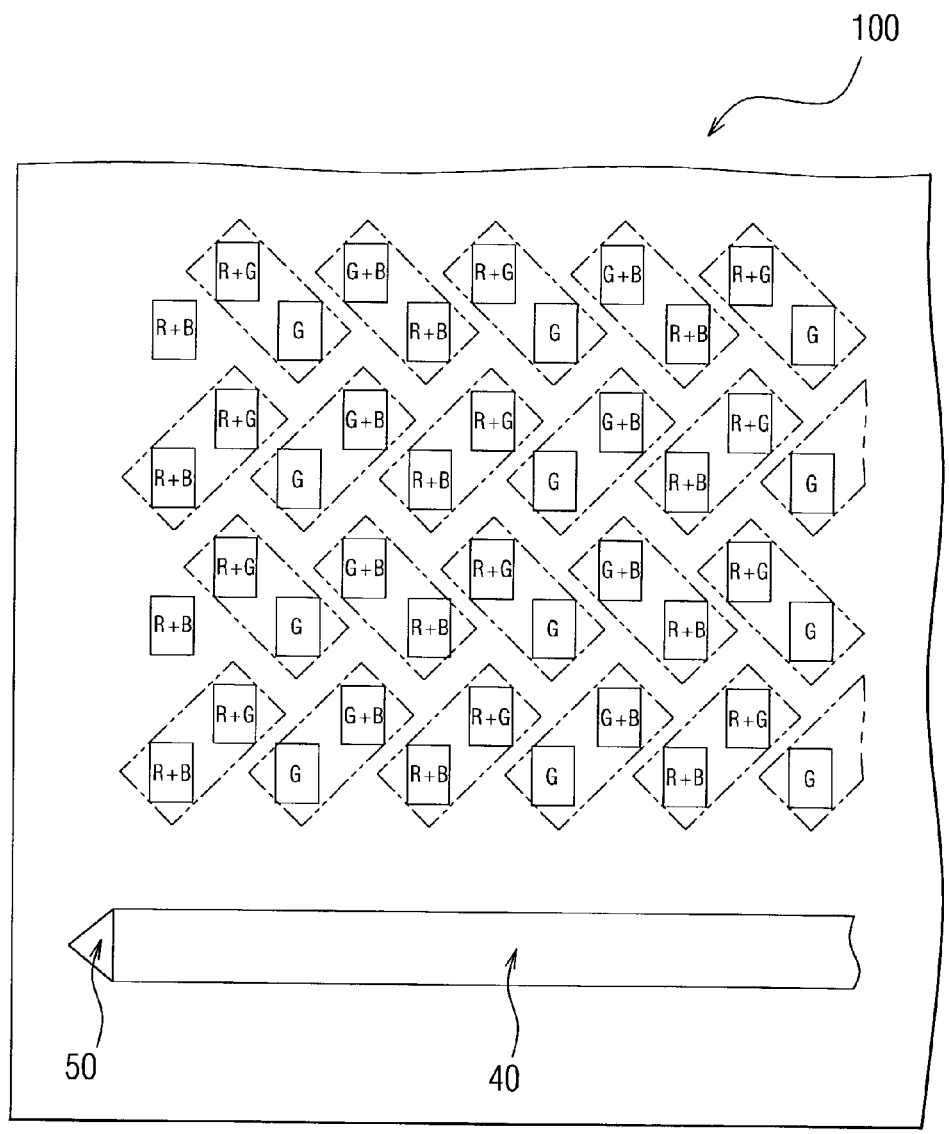

FIG. 2B shows the layout of pixels of three primary colors corresponding to the pixels shown in FIG. 2A. The magenta pixel G shown in FIG. 2A is represented by pixels R+B, the yellow pixel Y is represented by pixels R+G, and the cyan pixel C is represented by pixels G+B.

As apparent from FIG. 2B, two-pixel addition of the pixel combinations shown in FIG. 2A results in an addition of pixels R+B and pixels R+G, an addition of a pixel G and pixels G+B, an addition of pixels R+G and a pixel G, and an addition of pixels G+B and pixels R+B.

Outputs from the output circuit (signal unit generator) 50 have two patterns. For two-pixel addition of the class 1 and 2 pixel rows PR1 and PR2, a signal unit corresponding to the addition signal (R+B)+(R+G) of red, blue and green and a signal unit corresponding to the addition signal G+(G+B) of green and blue are alternately output. For two-pixel addition of the class 3 and 4 pixel rows PR3 and PR4, a signal unit corresponding to the addition signal (R+G)+G of red and green and a signal unit corresponding to the addition signal (G+B)+(R+B) of green, blue and red are alternately output.

In both the output patterns, if two signal units output in succession from the signal unit generator are added, a signal corresponding to an addition signal (2R+3G +2B) can be obtained. From this signal, a luminance signal can be obtained. Each signal unit will not become a white signal and always contains color signal information.

Many luminance signals (luminance information) and much color signal information can be obtained even if two-pixel addition is performed for the solid image pick-up device 100. It is therefore possible to suppress reduction of a resolution, generation of a false color, and reduction of a color S/N ratio.

With two-pixel addition, green, red and blue color signals can be calculated, for example, from the following equations (1). A high frequency luminance signal $Y_H$ can be calculated form the following equation (2).

The high frequency luminance signal $Y_H$ is a luminance signal which contains many high frequency components. A luminance signal can be obtained by combining the high frequency luminance signal $Y_H$ and a low frequency luminance signal $Y_L$ obtained from green, red and blue color signals. The resolution of an image is determined generally by the high frequency luminance signal $Y_H$.

$$G=3\{(G'+C_y)+(G'+Ye)-[(Mg+Ye)+(Mg+Cy)]/3\}/10$$

$$R=\{(Mg+Ye)-(G'+Cy)+G\}/2$$

$$B=\{(Mg+Cy)-(G'+Ye)+G\}/2 \qquad (1)$$

G: green color signal
R: red color signal
B: blue color signal
Mg: signal unit of magenta pixel charges
Ye: signal unit of yellow pixel charges
Cy: signal unit of cyan pixel charges
G': signal unit of green pixel charges $$Y_H = \{(Mg+Ye)+(G'+Cy)\}/K2 \qquad (2)$$
$$= \{(Mg+Cy)+(G'+Ye)\}/K2$$

$Y_H$: high frequency luminance signal
G': signal unit of green pixel charges
Ye: signal unit of yellow pixel charges
Cy: signal unit of cyan pixel charges
Mg: signal unit of magenta pixel charges
K2: constant for level adjustment of high frequency luminance signal $Y_H$ FIGS. 3A to 3D illustrate an operation sequence of two-pixel addition of pixel combinations shown in FIG. 2A. In these Figures, the layout of photoelectric conversion elements (pixels) 10, VCCD's (VCCD columns) 20, HCCD's (HCCD row) 40 and output circuit 50 of the solid state image pick-up device 100 is schematically shown. The signal unit generator is constituted of the VCCD's 20, HCCD's 40 and output circuit 50.

Charges accumulated in each pixel 10 are represented by a reference symbol made of a combination of a numeral and a lowercase letter. The numeral of the reference symbol for charges indicates the ordinal number of a pixel row as counted from the bottom, and the lowercase letter indicates the color of a pixel. In the following description, a pixel row having the ordinal number N as counted from the bottom is called an N-th pixel row.

For example, a reference symbol "1g" represents charges of a green pixel G in the first pixel row, and a reference symbol "8c" represents charges of a cyan pixel C in the eighth pixel row.

Figure 3A:
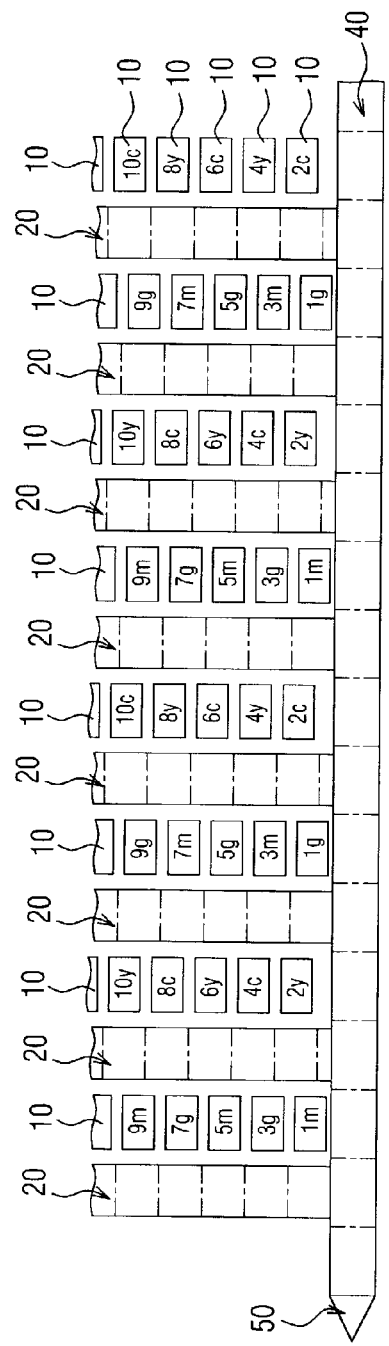
FIGS. 3A, 3B, 3C and 3D are schematic diagrams illustrating the operation sequence of two-pixel addition for combinations of pixels shown in FIGS. 2A and 2B.
Figure 3B:
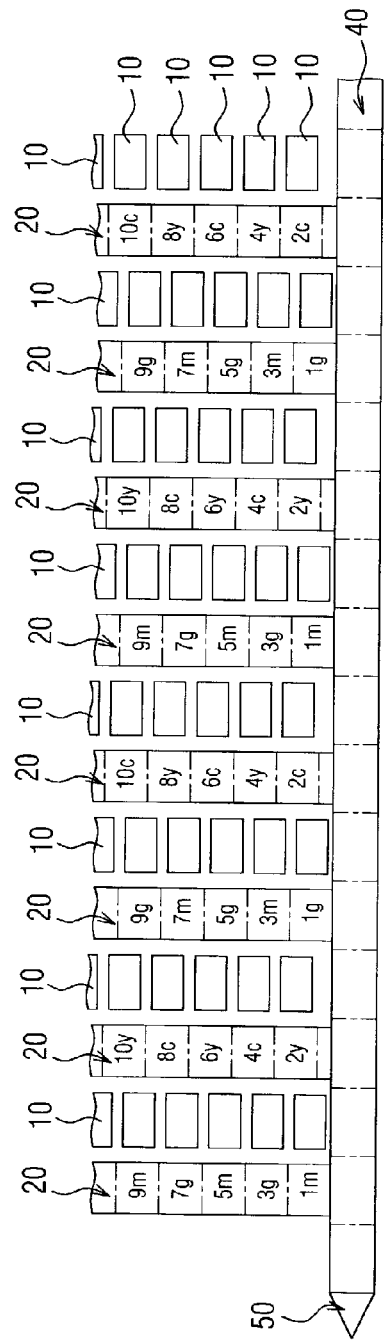

As shown in FIG. 3A, light is applied to each pixel 10 to accumulate charges. Charges are read from the pixels 10 into corresponding VCCD's. Namely, all-pixel read is performed.

Each block of VCCD 20 indicates one transfer stage constituted of four vertical transfer electrodes. A small block at the bottom of each even number VCCD column indicates one transfer stage constituted of two vertical transfer electrodes. The structure of a VCCD column 20 will be detailed later with reference to FIG. 4A.

Figure 3C:
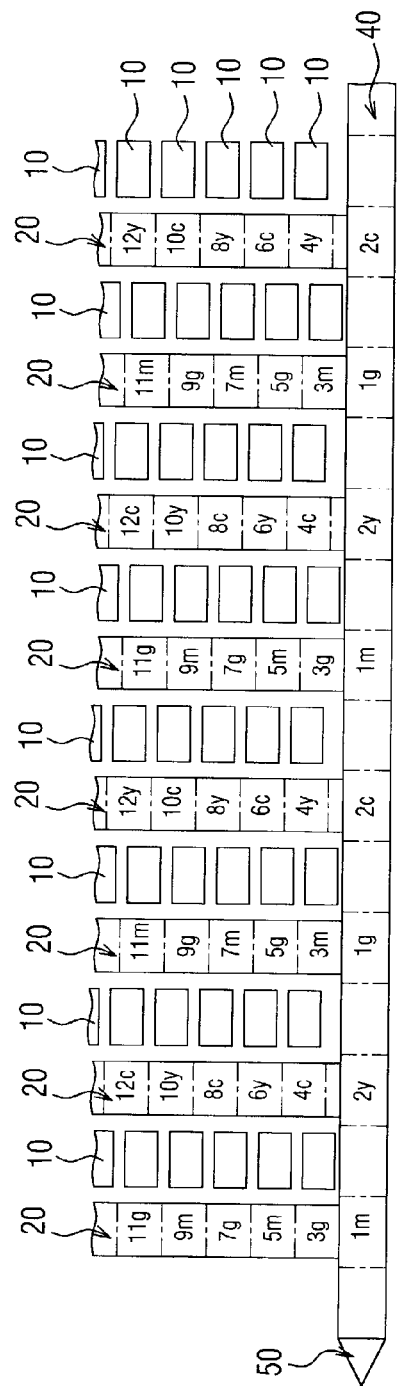

As shown in FIG. 3C, charges read from the first and second pixel rows are transferred to HCCD's 40. These charges are transferred from VCCD's 20 to HCCD's 40, for example, at the same timing.

Each block of HCCD 40 indicates one charge transfer stage constituted of two electrodes. The structure of the HCCD row 40 will be detailed later with reference to FIG. 4B.

The charges transferred to the HCCD's 40 are thereafter sequentially transferred to the output circuit 50. The output circuit 50 is controlled so that two sets of charges sequentially output from HCCD 40 are added to generate a voltage signal corresponding to the added charges. The voltage signal is amplified to output a signal (signal unit).

Under this control, two-pixel addition is executed between the class 1 pixel row PR1 of the first row and class 2 pixel row PR2 of the second row among combinations of pixels shown in FIGS. 2A and 2B. A signal unit representative of addition of charges 1g and 2c and a signal unit representative of addition of charges 1m and 2y are repetitively output from the output circuit 50.

Figure 3D:
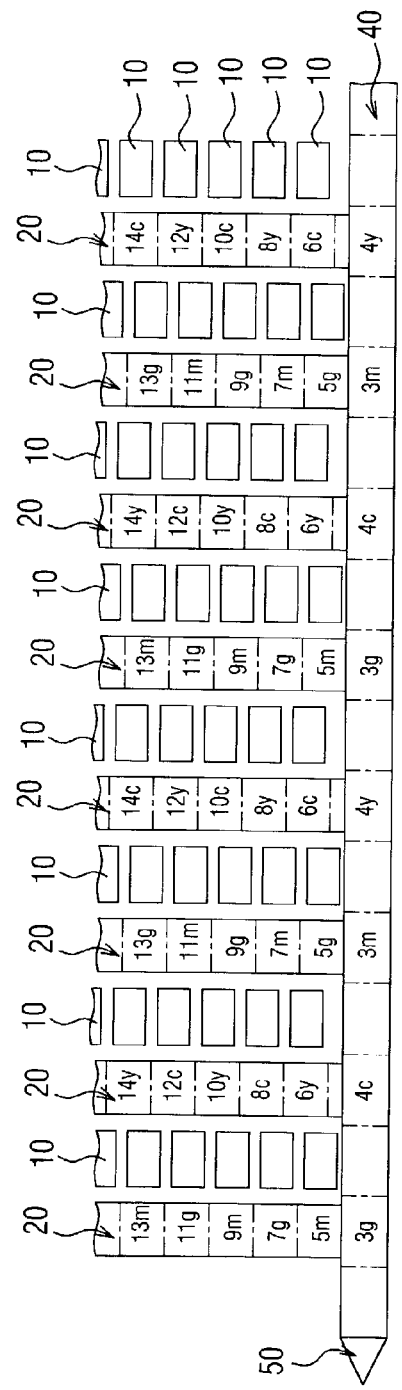

As shown in FIG. 3D, charges read from the third and fourth pixel rows are transferred to HCCD's 40. The charges transferred to HCCD's 40 are sequentially transferred to the output circuit 50. The output circuit 50 is controlled so that unnecessary charges are not detected but drained and two sets of necessary charges are added to generate a voltage signal corresponding to the added charges. The voltage signal is amplified to output a signal (signal unit).

Under this control, two-pixel addition is executed between the class 3 pixel row PR3 of the third row and class 4 pixel row PR4 of the fourth row among combinations of pixels shown in FIGS. 2A and 2B. A signal unit representative of addition of charges 4y and 3g and a signal unit of representative of addition of charges 4c and 3m are repetitively output from the output circuit 50.

Two-pixel addition between the class 1 pixel row PR1 and class 2 pixel row PR2 and two-pixel addition between the class 3 pixel row PR3 and class 4 pixel row PR4 are repetitively executed in the manner described above until two-pixel addition for all combinations of pixels shown in FIGS. 2A and 2B is completed.

Next, a specific structure of the solid state image pick-up device 100 capable of two-pixel addition will be described.

Figure 4A:
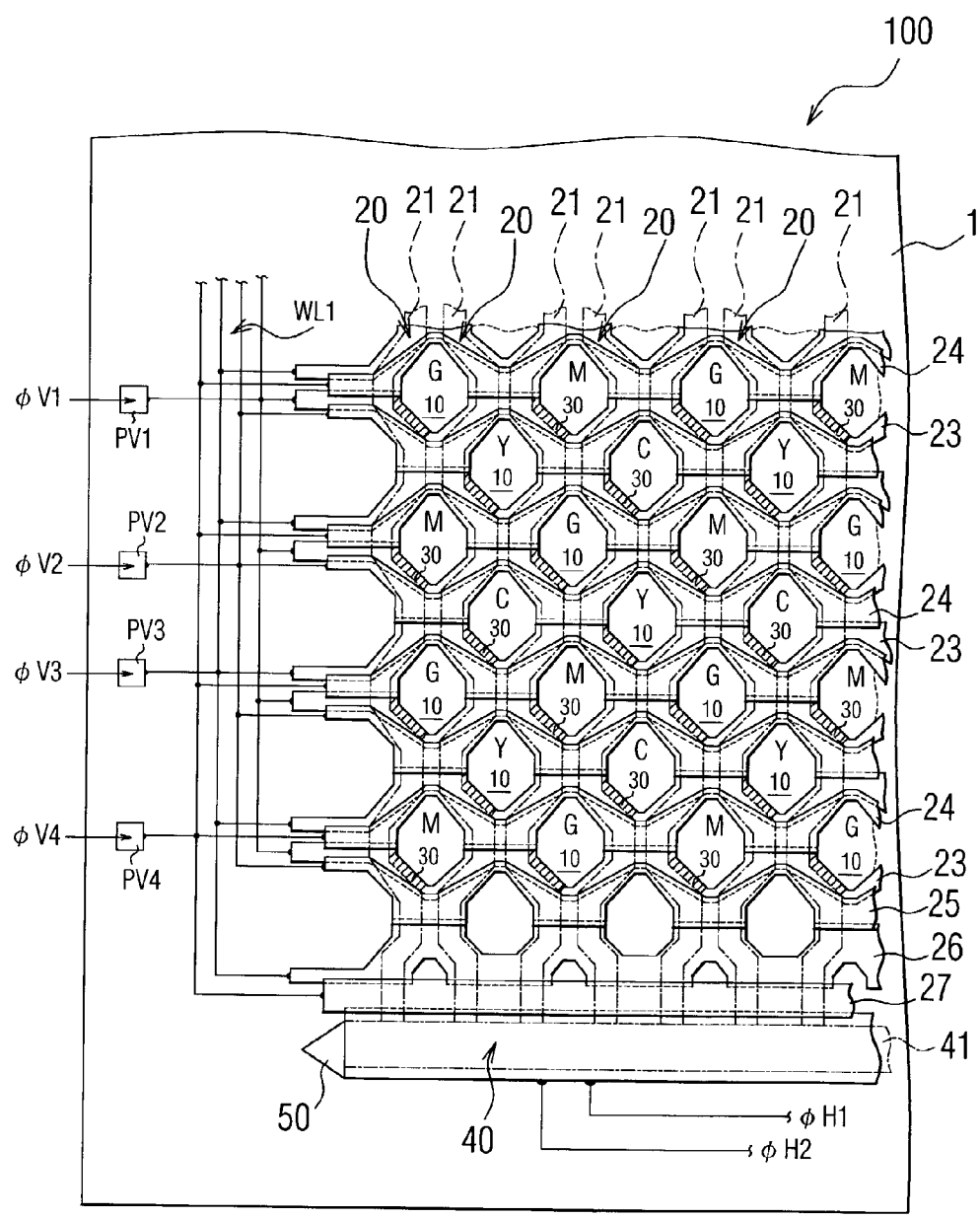

FIG. 4A is a schematic diagram showing the layout of pixels 10, VCCD columns 20, HCCD row 40 and output circuit 50 of the solid state image pick-up device.

On the principal surface of a semiconductor substrate 1, a number of pixels 10 are disposed in the honeycomb configuration. Each pixel 10 is, for example, a buried type photodiode. In FIG. 4A, the color of each pixel 10 is represented by M, G, C or Y.

A VCCD column 20 is disposed in a zigzag way along each pixel column. Each VCCD column 20 includes; a vertical charge transfer channel 21 formed on the semiconductor substrate; first polysilicon and second polysilicon vertical transfer electrodes 23 and 24 formed on the semiconductor substrate 1 with an electrically insulating film (not shown) being interposed; and first to third auxiliary transfer electrodes 25 to 27.

The first polysilicon and second polysilicon vertical transfer electrodes, two electrodes 23 and 24, are disposed along one pixel row. The first polysilicon vertical transfer electrode 23 extending at the downward position of the pixel 10 row also functions as read gates 30 for controlling charge transfer from pixels to VCCD's 20. The read gate 30 is shown hatched. The read gate 30 is formed at a ratio of one read gate to four transfer electrodes.

Each VCCD 20 is a four-phase drive type CCD. Drive signals $\phi V1$ to $\phi V4$ are supplied via pads PV1 to PV4 and wiring lines WL.

In order to perform all-pixel read, a read pulse (e.g., 15 V) is superposed upon the drive signals $\phi V1$ and $\phi V3$ at the same timing or slightly shifted timings. In response to the read pulse, charges accumulated in each pixel 10 are read into the corresponding VCCD 20 via the read gate 30. Each VCCD 20 is driven by the drive signals $\phi V1$ to $\phi V4$ so that charges read from each pixel 10 are transferred toward HCCD 40. By transferring one stage, the phases of charges in the odd and even columns can be made coincident.

Each HCCD 40 is a two-phase drive type CCD driven by two-phase drive signals $\phi H1$ and $\phi H2$. The HCCD row includes; a horizontal charge transfer channel 41 formed on the semiconductor substrate; and first polysilicon and second polysilicon horizontal transfer electrodes formed on the semiconductor substrate with an electrically insulating film (not shown) being interposed. A pair of horizontal transfer electrodes is connected to form one horizontal transfer electrode. In FIG. 4A, horizontal transfer electrodes are not shown and only an outline of all horizontal transfer electrodes is schematically shown. HCCD's 40 transfer charges received from VCCD's 20 toward the output circuit 50.

The output circuit 50 detects charges output from HCCD 40 to generate a voltage signal and amplify and output it.

FIG. 4B is a schematic diagram showing the structure of HCCD's 40 and output circuit 50.

As shown in FIG. 4B, the semiconductor substrate 1 includes an n-type semiconductor substrate 1a and a p-type impurity diffusion region 1b formed on one surface of the n-type semiconductor substrate 1a.

The horizontal charge transfer channel 41 is constituted of n-type impurity diffusion regions 41a and n⁻-type impurity diffusion regions 41b alternately formed in the p-type impurity diffusion region 1b. A sign + of the impurity concentration means a high concentration and a sign − means a low concentration. Therefore, $n^+ > n > n^-$, $p^+ > p > p^-$.

Horizontal transfer electrodes 42 and 43 are disposed on an electrically insulating film 3 over the impurity diffusion regions 41a and 41b. Two first polysilicon horizontal transfer electrodes 42 and two second polysilicon transfer electrodes 43 are disposed for each VCCD 20.

Of the four horizontal transfer electrodes 42 and 43 for each VCCD 20, the downstream side two horizontal transfer electrodes are connected in common to receive the drive signal $\phi H2$, and the upstream side two horizontal transfer electrodes are connected in common to receive the drive signal $\phi H1$. One first polysilicon horizontal transfer electrode 42, one upstream second polysilicon horizontal transfer electrode 43 and the horizontal charge transfer channel 41 under the electrodes 42 and 43 constitute one block of HCCD 40 shown in FIGS. 3A to 3D. Each horizontal transfer electrode 42, 43 is covered with an electrically insulating film IF such as a thermally oxidized film.

The output circuit 50 includes: for example, an output gate 51 connected to an output terminal of HCCD 40; a floating diffusion (FD) region 52 formed in the semiconductor substrate 1 adjacent to the output gate 51; a floating diffusion amplifier (FDA) 53 electrically connected to the FD region; a reset gate 54 disposed adjacent to the FD region 52; and a drain region 55 formed in the semiconductor substrate 1 adjacent to the reset gate 54.

The output gate 51 includes: for example, a channel region 51a made of an n⁻type impurity diffusion region formed in the p-type impurity diffusion region 1b; and a gate electrode 51b formed on the channel region 51a with the electrically insulating film 3 being interposed. The gate electrodes 51b is covered with the electrically insulating film IF such as a thermally oxidized film. A d.c. voltage $V_{OG}$ is applied to the output gate 51 to transfer charges from HCCD 40 to the FD region 52.

The FD region 52 is made of, for example, an n⁺-type impurity diffusion region formed in the p-type impurity diffusion region 1b.

FDA 53 has, for example, four transistors Q1, Q2, Q3 and Q4. FDA 53 detects charges in the FD region 52 to generate a voltage signal, amplify and output it.

The reset gate 54 includes: for example, a channel region 54a made of an n-type impurity diffusion region formed in the p-type impurity diffusion region 1b; and a gate electrode 54b formed on the electrically insulating film 3 over the channel region. The gate electrode 54b is covered with the electrically insulating film IF such as a thermally oxidized film.

The reset gate 54 is driven by a drive signal φRS to drain charges after detected by FDA 53 or charges unnecessary to be detected by FDA 53, from the FD region 52 to the drain region 55.

The drain region 55 is made of, for example, an n⁺-type impurity diffusion region formed in the p-type impurity diffusion region 1b. Charges drained to the drain region 55 are absorbed, for example, by the power supply voltage $V_{DD}$.

The FD region 52, reset gate 54 and drain region 55 constitute the reset transistor.

By properly selecting the waveform of the drive signal φRS for driving the reset gate 54, the output circuit 50 can perform two-pixel addition.

Figure 5A:
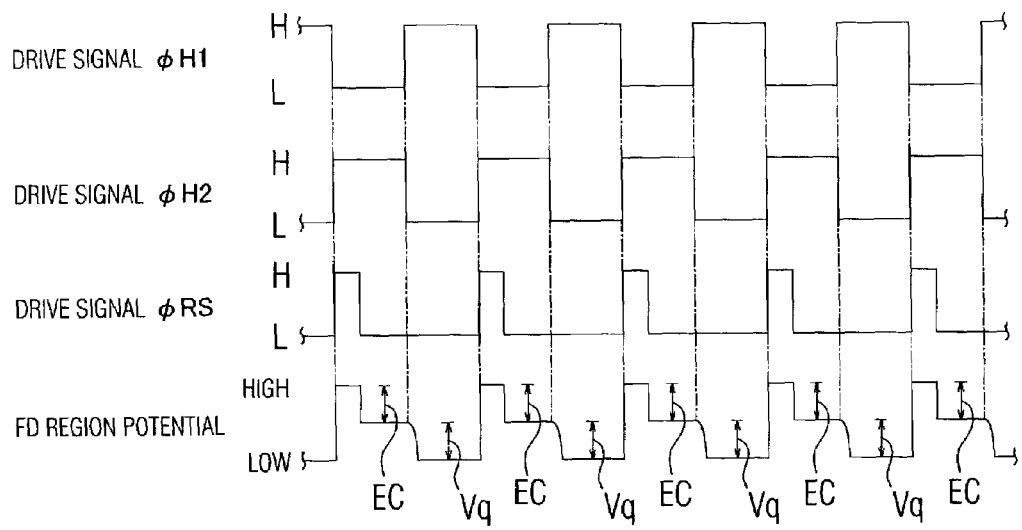
FIGS. 5A and 5B are schematic diagrams showing the relation between the waveform of a drive signal φRS and the potential at an FD region during individual pixel read and pixel addition read.
Figure 5B:
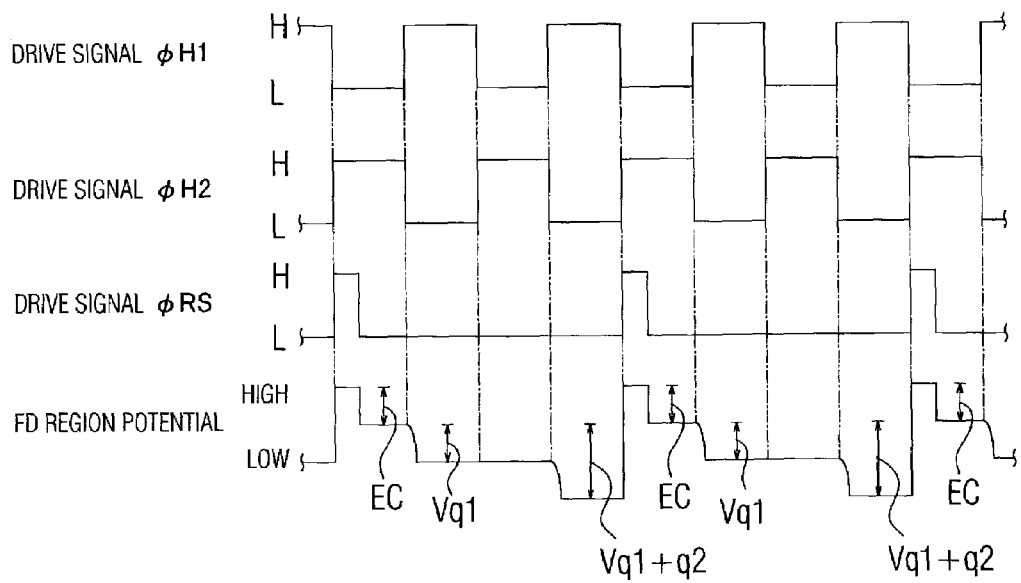

FIG. 5A shows the relation between the waveform of the drive signal φRS in a individual pixel read operation and the potential of the FD region 52 (refer to FIG. 4B). FIG. 5B shows the waveform of the drive signal φRS in a two-pixel read operation and the potential of the FD region 52.

In this specification, an operation of generating a signal unit without pixel addition is called "individual pixel read operation" and an operation of generating a signal unit with pixel addition is called "pixel addition read operation", where appropriate.

As shown in FIG. 5A, in the individual pixel read operation, the drive signal φRS changes from a low level L (e.g., 0 V) to a high level (e.g., 3 V) at the same timing as that of the drive signal φH2 having the opposite phase to the drive signal φH1. The duration of the high level H of the drive signal φRS is shorter than the duration of the high level H of the drive signal φH2.

When the drive signal φRS takes the high level H, the reset gate 54 is opened so that charges in the FD region 52 (refer to FIG. 4B) are drained to the drain region 55. The potential of the FD region 52 rises to the power supply voltage $V_{DD}$ and the output of the FD region 52 rises.

When the drive signal φRS takes the low level L, the reset gate 54 is closed. In this case, the electrostatic coupling capacitance between the reset gate 54 and FD region 52 slightly lowers the potential of the FD region 52. The lowered potential is represented by EC in FIG. 5A.

When the drive signal φH2 changes from a high level H (e.g., 3 V) to a low level L (e.g., 0 V), charges are transferred from HCCD 40 to the FD region 52. The potential of the FD region 52 lowers by the potential $V_q$ corresponding to the transferred charges. FDA 53 detects the output from the FD region 52 to generate a voltage signal and amplify and output it. This output signal is a signal unit.

As shown in FIG. 5B, in the pixel addition read operation, the drive signal φRS changes from the low level L to the high level at the same timing as that of the drive signal φH2, once per two periods of the drive signal φH2.

Similar to the individual pixel read operation, when the drive signal φRS takes the high level H, the reset gate 54 is opened so that charges in the FD region 52 are drained to the drain region 55. The output of the FD region 52 rises.

When the drive signal φRS takes the low level L, the reset gate 54 is closed. In this case, the electrostatic coupling capacitance between the reset gate 54 and FD region 52 slightly lowers the potential of the FD region 52. The lowered potential is represented by EC in FIG. 5B.

While the drive signal φRS takes the low level L, the drive signal φH2 changes from the high level H to low level L, from the low level L to high level H, and from the high level H to low level L. Each time the drive signal φH2 changes from the high level H to low level L, charges are transferred from HCCD 40 to the FD region 52. While the drive signal φRS takes the low level L, charges are transferred twice from HCCD 40 to the FD region 52. In the FD region 52, charges of two pixels are added.

As charges are transferred at the first time from HCCD 40 to the FD region 52, the potential of the FD region 52 lowers by the potential $V_{q1}$ of the transferred charges. The output of the FD region 52 lowers further by the potential $V_{q1}$ of the transferred charges. As charges are transferred at the second time from HCCD 40 to the FD region 52, the potential of the FD region 52 lowers further by the potential $V_{q2}$ of the transferred charges. The output of the FD region 52 lowers further by the potential $V_{q2}$ of the transferred charges. FDA 53 detects the output from the FD region 52 to generate a voltage signal and amplify and output it. This output signal is a signal unit.

Next, an image pick-up apparatus of the first embodiment will be described.

Figure 6:
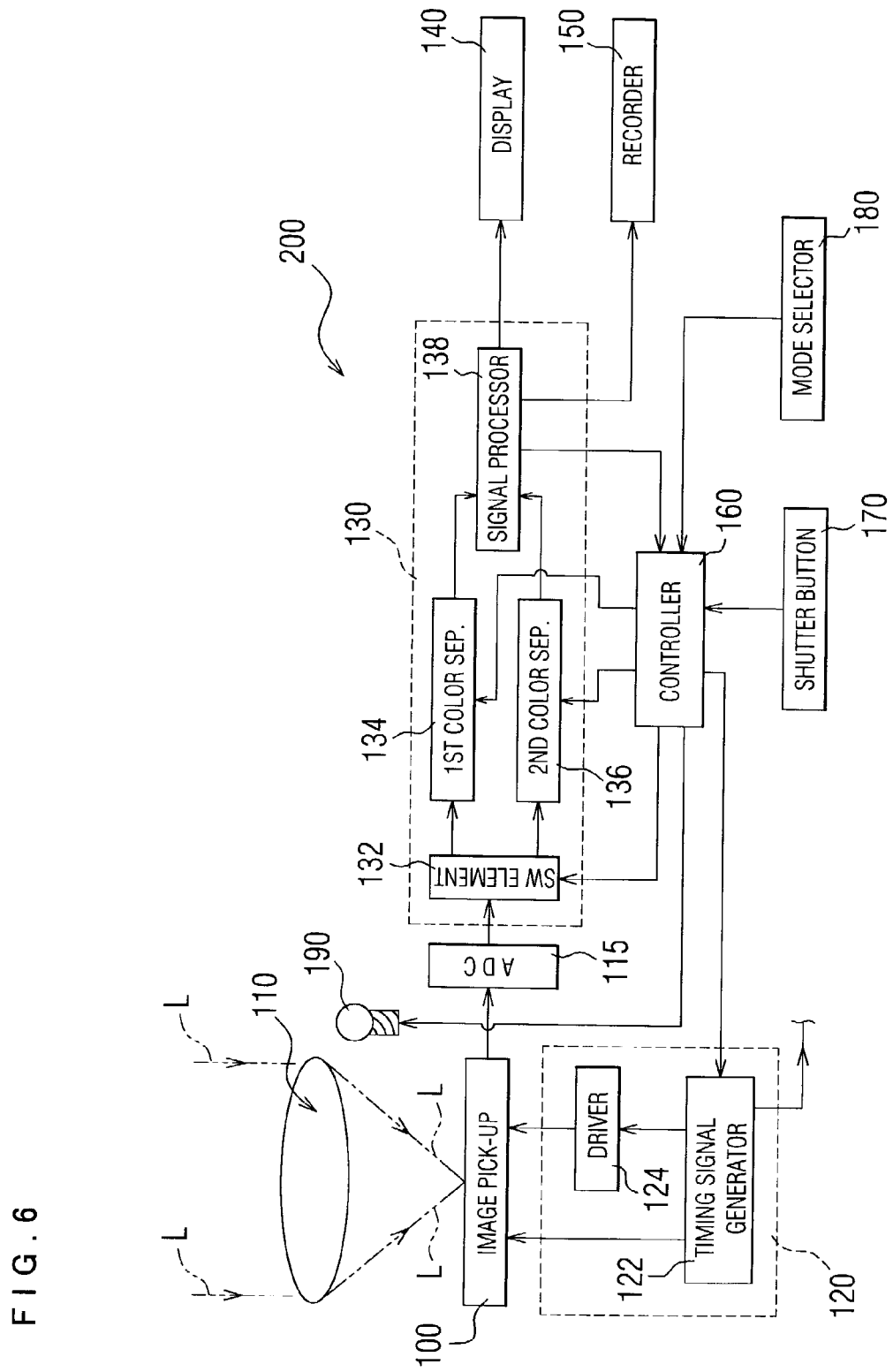
FIG. 6 is a block diagram schematically showing the structure of an image pick-up apparatus according to a first embodiment.

FIG. 6 is a block diagram showing the outline of an image pick-up apparatus (digital still camera) of the first embodiment. The image pick-up apparatus 200 has a solid state image pick-up device 100, an image pick-up optical system 110, an analog/digital (A/D) converter unit 115, a drive signal generator 120, an image signal generator 130, a display 140, a recorder 150, a controller 160, a shutter button 170, a mode selector 180, and an electronic flash 190.

The structure of the solid state image pick-up device 100 has been described earlier, and the description thereof is omitted.

The image pick-up optical system 110 includes: for example, a plurality of optical lenses; an optical lens drive mechanism for moving optical lenses along the optical axis; an optical aperture; an optical aperture open/close mechanism for opening/closing the optical aperture; an optical low-pass filter; and the like. The image pick-up optical system 110 focusses an optical image on the solid state image pick-up device 100. In FIG. 6, a single optical lens is shown to represent the image pick-up optical system 110. An arrow L shown in FIG. 6 indicates an optical beam.

The A/D converter unit 115 receives a signal unit from the solid state image pick-up device 100 (output circuit 50), performs an analog gain adjustment process and a noise reduction process by correlation double sampling, and thereafter converts the analog signal into a digital signal.

The drive signal generator 120 has a timing signal generator 122 and a driver 124. The timing signal generator 122 includes a memory (not shown) storing timing data for generating signals necessary for each operation mode of the image pick-up apparatus 200, and other data. In accordance with the data stored in the memory, the timing signal generator 122 generates various timing signals for synchronizing various circuits. The timing signals are supplied to the driver 124, image signal generator 130, controller 160 and the like. The timing signal generator 122 also generates signals necessary for driving the solid state image pick-up device 100. Some of the signals such as the drive signals φH1, φH2 and φRS are supplied to the solid state image pick-up device 100, and the remaining signals are supplied to the driver 124.

The driver 124 has, for example, a vertical driver, a DC power supply and the like. In accordance with a signal supplied from the timing signal generator 122, the driver 124 generates vertical drive signals φV1 to φV4 and the like. The vertical drive signals are supplied to the solid state image pick-up device 100.

The image signal generator 130 includes a switching (SW) element 132, a first color separator 134, a second color separator 136 and a signal processor 138.

The SW element 132 receives an output signal from the A/D converter unit 115. If this output signal is a signal generated during the individual pixel read operation, it is supplied to the first color separator 134. If the output signal from the A/D converter unit 115 is a signal generated during the pixel addition read operation, it is supplied to the second color separator 136.

By using the output signal from the A/D converter unit 115, the first or second color separator 134 or 136 generates red, green and blue color signals, a luminance signal and the like. These signals are supplied to the signal processor 138.

For example, the first color separator 134 generates red, green and blue color signals by using the following equation (3), and generates the high frequency luminance signal $Y_H$ by using the following equation (4):

$$G=(G'+Ye+Cy-Mg)/3$$

$$R=(Mg+Ye-Cy)/2$$

$$B=(Mg+Cy-Ye)/2 \quad (3)$$

G: green color signal
R: red color signal
B: blue color signal
G': signal unit of green pixel charges
Ye: signal unit of yellow pixel charges
Cy: signal unit of cyan pixel charges
Mg: signal unit of magenta pixel charges $$Y_H=(2G'+Ye+Cy+Mg)/K1 \quad (4)$$

$Y_H$: high frequency luminance signal
G': signal unit of green pixel charges
Ye: signal unit of yellow pixel charges
Cy: signal unit of cyan pixel charges
Mg: signal unit of magenta pixel charges
K1: constant for level adjustment of high frequency luminance signal $Y_H$ For example, the second color separator 136 generates red, green and blue color signals by using the previously described equation (1), and generates the high frequency luminance signal $Y_H$ by using the previously described equation (2).

The signal processor 138 performs various processes in accordance with color signal information, luminance signal information and the like supplied from the first or second color separator 134 or 136, and generates various signals such as image signals, a luminance signal and the like for each operation mode of the image pick-up device 200. Signals generated by the signal processor 138 are supplied to the display 140, recorder 150 or controller 160.

The display 140 may be a liquid crystal display and displays a still image or moving image in accordance with image signals supplied from the signal processor 138.

The recorder 150 records image signals supplied from the signal processor 138 in a storage medium such as a memory card.

The controller 160 may be a central processor unit (CPU). In accordance with signals supplied from a shutter bottom 170, a mode selector 180 or the signal processor 138, the controller 160 controls the operations of the image pick-up optical system 110, timing signal generator 122, SW element 132, first color separator 134, second color separator 136 and signal processor 138.

The mode selector 180 is a switch for selecting the operation mode of the image pick-up apparatus 200. The electronic flash 190 may be a strobe whose operation is controlled by the controller 160.

A user can select the operation mode of the image pick-up apparatus 200 by using the mode selector 180. The operation mode includes a high image quality mode during the individual pixel read operation and a high sensitivity mode during the addition pixel read operation. An automatic image pick-up mode function may be provided to make the controller 160 select either the individual pixel read operation or pixel addition read operation.

For example, after the power is turned on, the automatic image pick-up mode is forcibly set and a moving image or still image can be displayed on the display 140. When another operation mode is selected thereafter by using the mode selector 180, a moving image or still image can be displayed on the display 140 in the selected operation mode.

For example, if the light amount of an image displayed on the display 140 in the high image quality mode is insufficient, the high sensitivity mode or automatic image pick-up mode may be selected by using the mode selector 180. The sensitivity of the image pick-up apparatus 200 can be increased by two-pixel addition. If the light amount of an image is still insufficient even if the sensitivity of the image pick-up apparatus is increased, the electronic flash 190 is operated to increase the amount of light from a subject.

Next, four-pixel addition will be described by using a solid state image pick-up device having the pixel layout same as that shown in FIG. 1. Also in the case of four-pixel addition, if pixel addition which generates white signals, i.e., pixel addition of two magenta pixels M and two green pixels G, is not performed, it is possible to suppress reduction of a luminance, generation of a false color, and reduction of a color S/N ratio.

Figure 7:
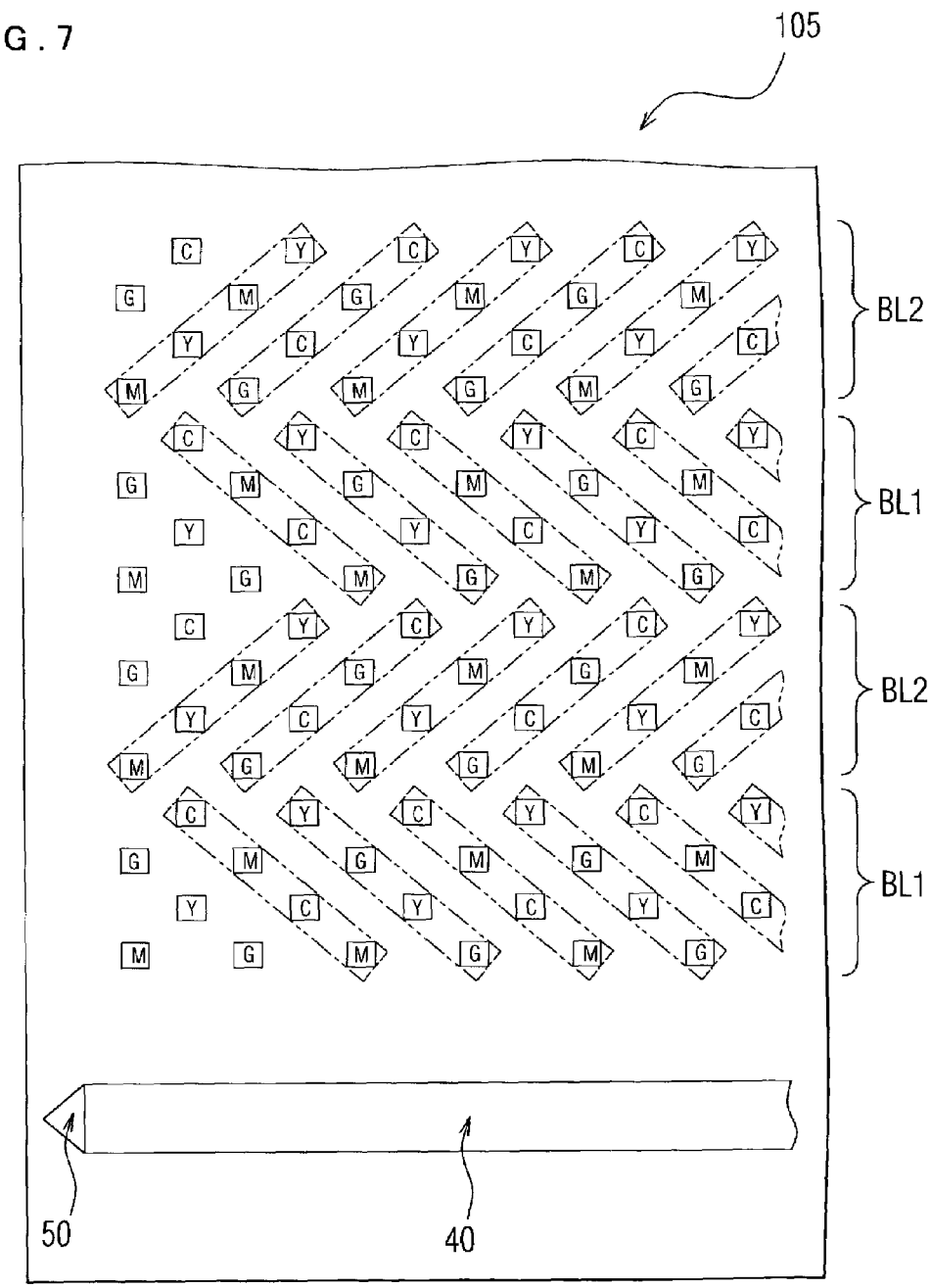
FIG. 7 is a schematic diagram showing an example of combinations of pixels which combinations generate no white signal when four-pixel addition is performed by a solid state image pick-up device having the pixel layout shown in FIG. 1.

FIG. 7 shows an example of combinations of pixels for four-pixel addition of a solid state image pick-up device 105 having the pixel layout same as that shown in FIG. 1, the pixel addition generating no white signal.

In FIG. 7, four pixels surrounded by a two-dot chain line are added. Pixel rows are classified into first and second blocks BL1 and BL2 in accordance with the colors of pixels to be added. Each of the blocks BL1 and BL2 is constituted of four pixel rows disposed along the pixel column direction. The first and second blocks BL1 and BL2 are disposed alternately.

In the first block BL1, four-pixel addition of two magenta pixels M and two cyan pixels C aligned obliquely and four-pixel addition of two green pixels G and two yellow pixels Y aligned obliquely are performed. In the second block BL2, four-pixel addition of two magenta pixels M and two yellow pixels Y aligned obliquely and four-pixel addition of two green pixels G and two cyan pixels C aligned obliquely are performed. Charges of pixels not used for addition are drained at proper timings.

In both the first and second blocks BL1 and BL2, an addition signal of two signal units of four-pixels output in succession from the output circuit (signal unit generator) 50 is a signal (4R+6G+4B) of red, green and blue pixels. By using this signal, a luminance signal can be obtained. Each signal unit is not a white signal but it always contains color signal information.

Even with four-pixel addition, many luminance signals (luminance information) can be obtained and much color signal information can be obtained. It is therefore possible to suppress reduction of a luminance, generation of a false color, and reduction of a color S/N ratio.

After four-pixel addition is performed, red, green and blue pixel signals can be calculated by the equation (1) and a high frequency luminance signal $Y_H$ can be calculated from the equation (2).

FIGS. 8A to 8I illustrate the operation sequence of four-pixel addition of pixel combinations shown in FIG. 7. In FIG. 7, reference symbols and numerals are similar to those shown in FIGS. 3A to 3D. VCCD's 20A, HCCD's 40 and an output circuit 50 constitute a signal unit generator for adding charges of a plurality of pixels to generate a signal unit.

Figure 8A:
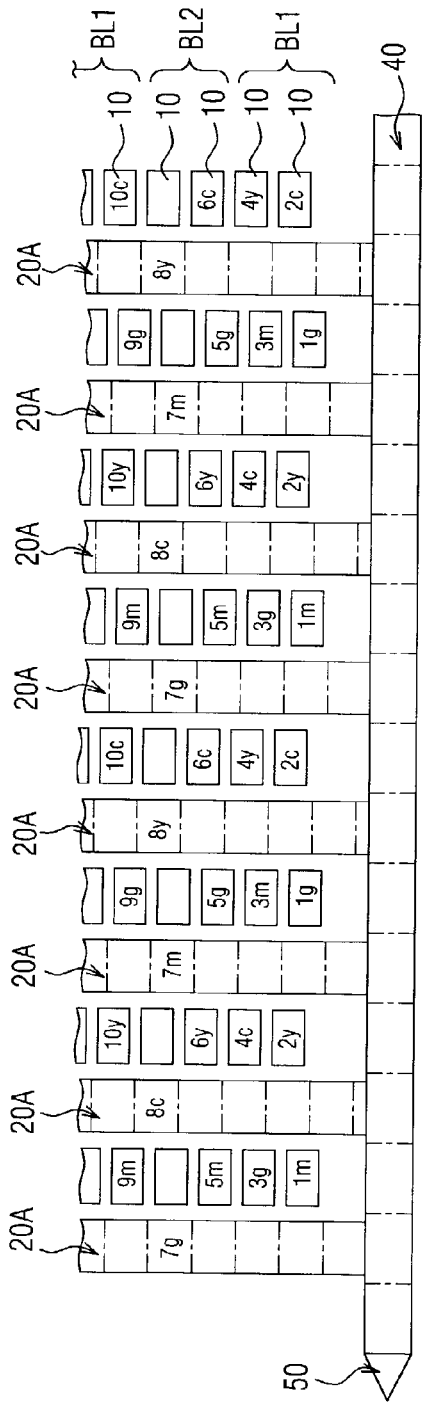

As shown in FIG. 8A, light is applied to each pixel 10 to accumulate charges. Charges are read from the pixels 10 in the two upstream pixel rows of the second block BL2 into corresponding VCCD's 20A.

Figure 8B:
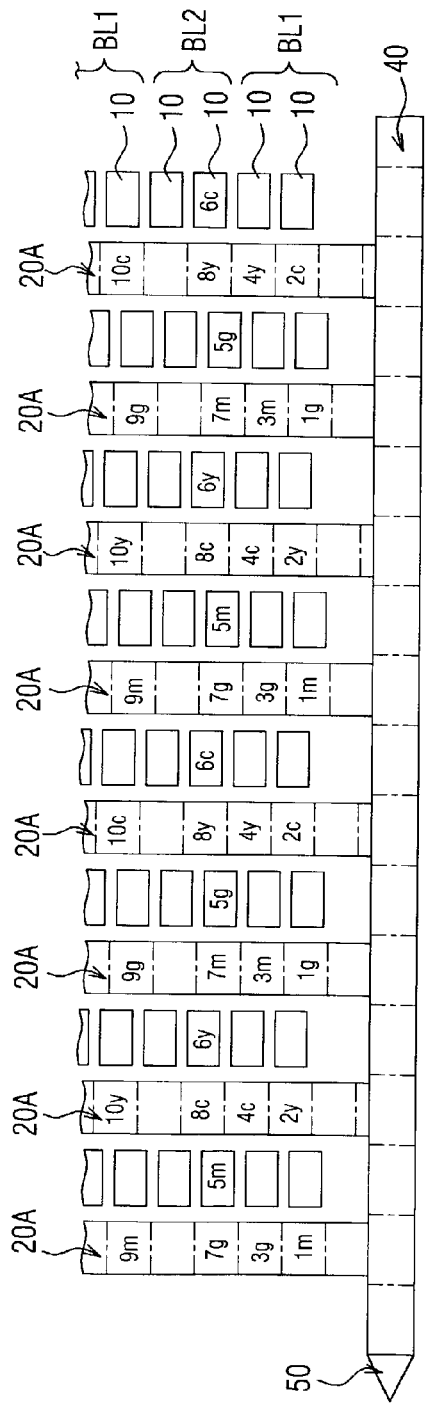

As shown in FIG. 8B, charges in VCCD's 20A are transferred downstream by one transfer stage from the state shown in FIG. 8A. Charges are read from the pixels 10 in the first block BL1 into corresponding VCCD's 20A.

Figure 8C:
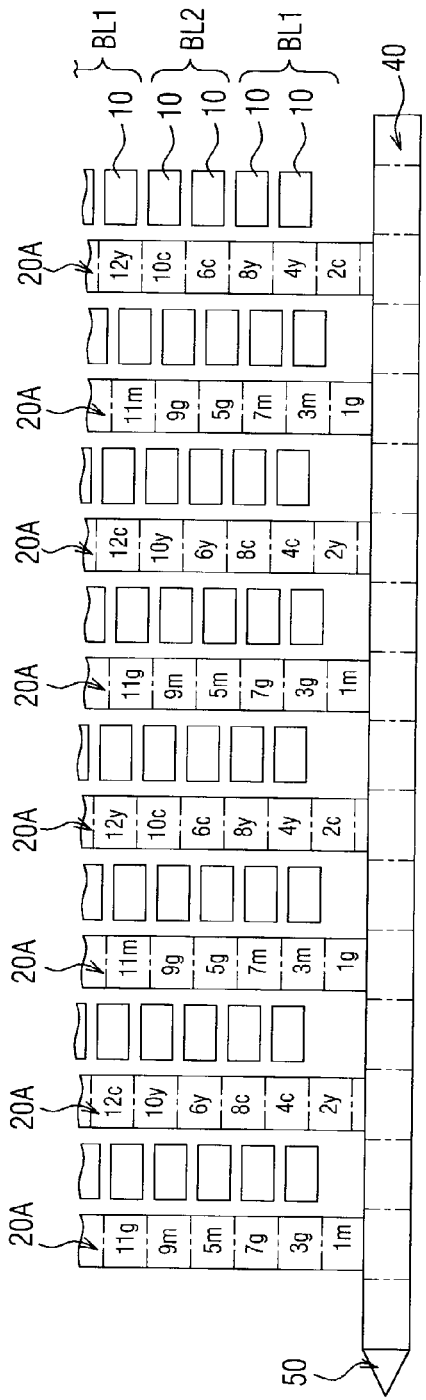

As shown in FIG. 8C, charges in VCCD's 20A are transferred downstream by one transfer stage from the state shown in FIG. 8B, and charges are read from the pixels in the two downstream pixel rows in the second block BL2 into corresponding VCCD's 20A. Charges are therefore read from all pixels 10 into corresponding VCCD's 20A. Namely, all-pixel read is completed.

Figure 8D:
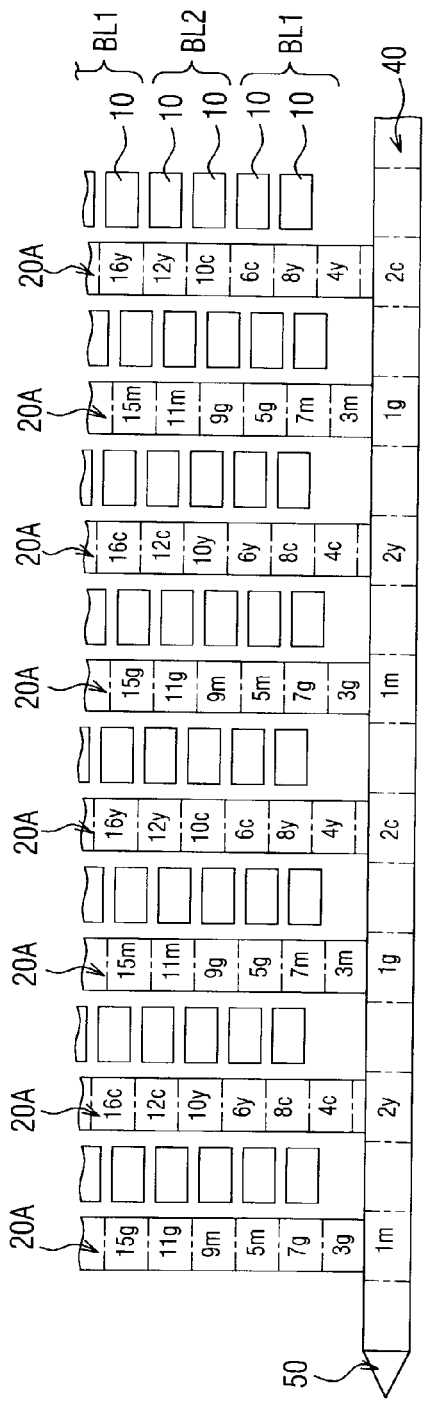

As shown in FIG. 8D, the charges read from the two downstream pixel rows in the most downstream first block BL1 are transferred to HCCD's 40. These charges are transferred from VCCD's 20A to HCCD's 40 at the same timing.

Figure 8E:
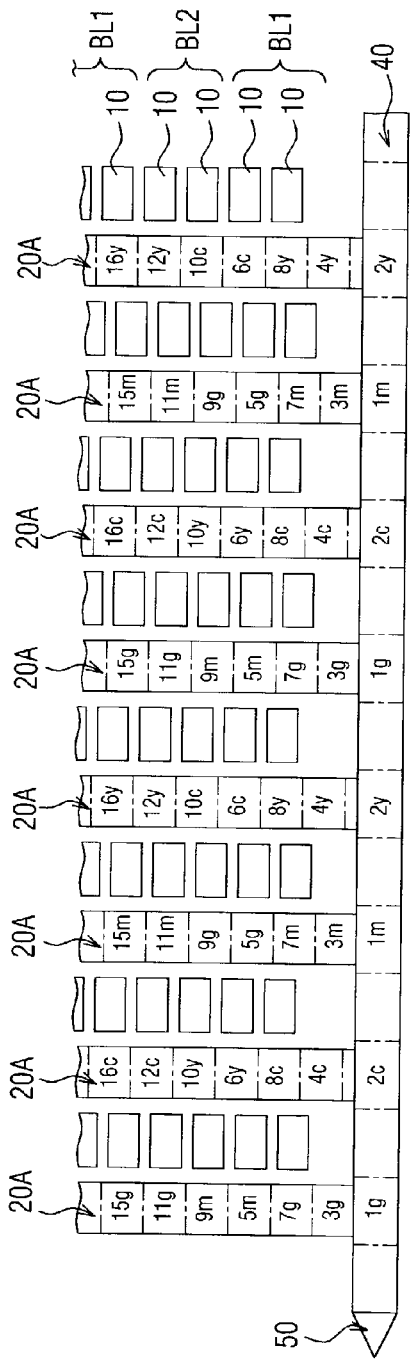

As shown in FIG. 8E, charges in HCCD's are transferred downstream by four transfer stages. Charges in VCCD's in the most downstream row and corresponding charges in HCCD's have the same color.

Figure 8F:
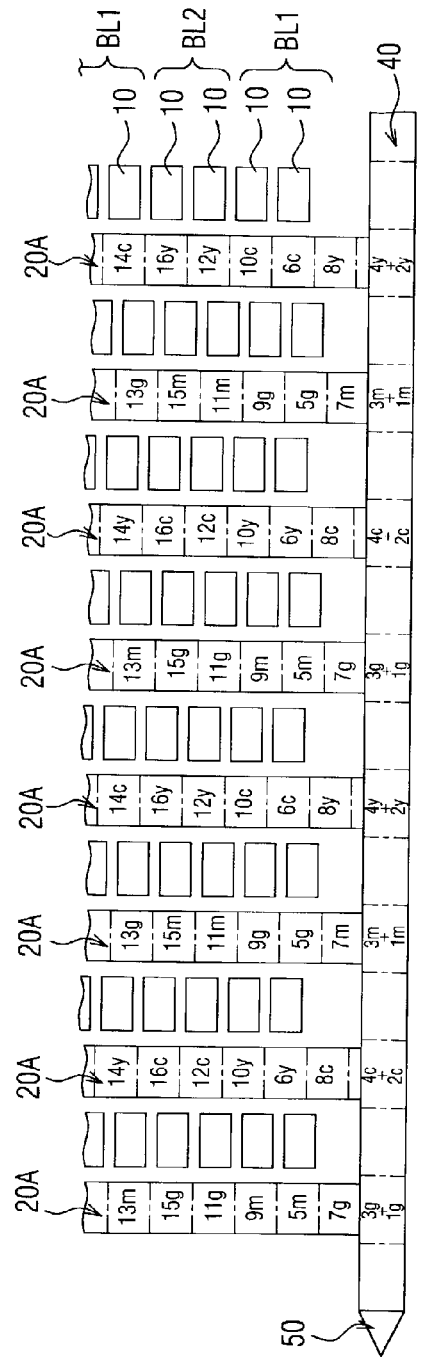

As shown in FIG. 8F, while the charge transfer operation for HCCD's 40 is stopped, charges in VCCD's 20A in the most downstream row are transferred to HCCD's 40. The charges read from the two pixel rows on the upstream side of the most downstream first block BL1 are therefore transferred to HCCD's 40. Charges accumulated in two pixels having the same color and transferred via VCCD's 20A are therefore added in each of HCCD's.

Thereafter, the charges in HCCD's 40 are sequentially transferred to the output circuit 50. The operation of the output circuit 50 is controlled in such a manner that the charges (1g+3g) transferred at the first time are drained and the charges successively transferred at two steps of four pixels transferred from the second and following times are added to generate a voltage signal corresponding the charge amount and output an amplified voltage signal (signal unit).

With this control, four-pixel addition for the most downstream first block BL1 among combinations of pixels shown in FIG. 7 can be performed. The output circuit 50 repetitively outputs a signal unit adding four sets of charges 1m, 2c, 3m and 4c and a signal unit adding four sets of charges 1g, 2y, 3g and 4y.

Figure 8G:
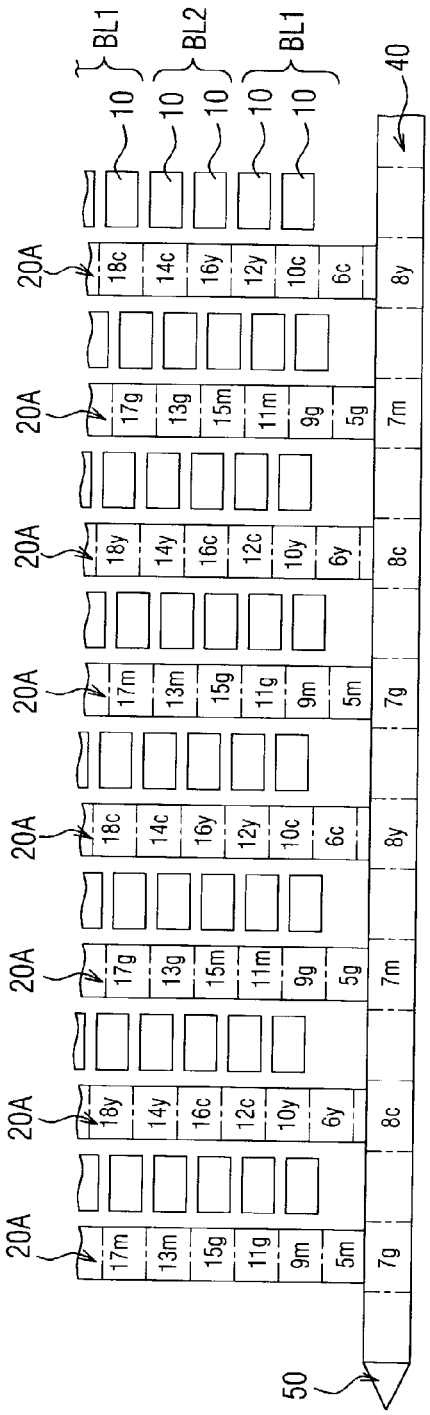

As shown in FIG. 8G, charges in VCCD's 20A in the most downstream pixel row are transferred to HCCD's 40. Charges read from the pixels in the two upstream pixel rows in the most downstream second block BL2 are therefore transferred to HCCD's 40.

Figure 8H:
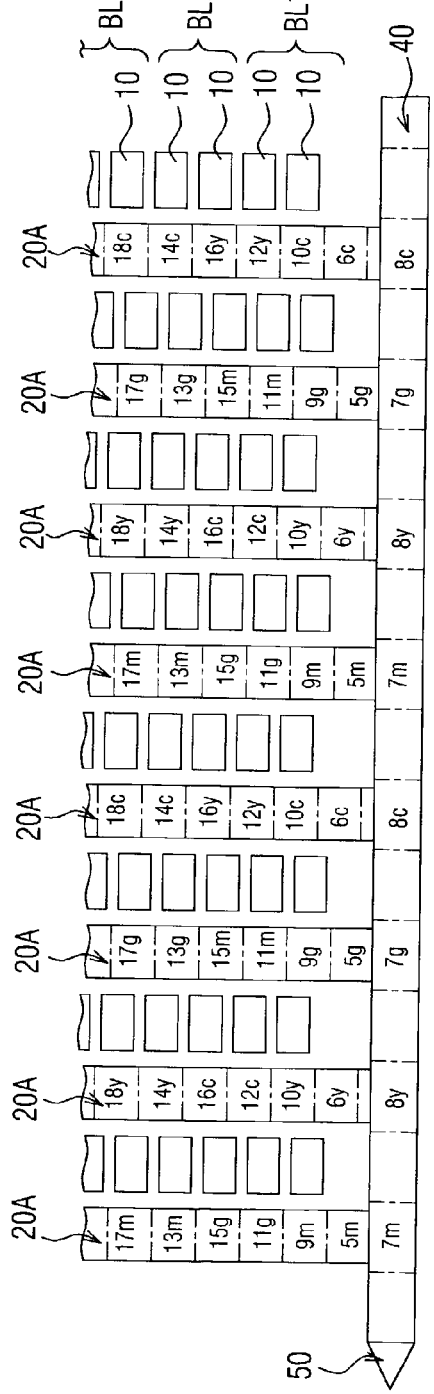

As shown in FIG. 8H, the charges in HCCD's 40 are transferred downstream by four charge transfer stages. Charges in VCCD's in the most downstream row and corresponding charges in HCCD's have the same color.

As shown in FIG. 8I, while the charge transfer operation for HCCD's 40 is stopped, charges in VCCD's 20A in the most downstream row are transferred to HCCD's 40.

The charges read from the two pixel rows on the downstream side of the most downstream second block BL2 are therefore transferred to HCCD's 40. Charges accumulated in two pixels having the same color and transferred via VCCD's 20A are therefore added in each of HCCD's.

Thereafter, the charges in HCCD's 40 are sequentially transferred to the output circuit 50. The operation of the output circuit 50 is controlled in such a manner that the charges of four pixels sequentially output from HCCD 40 are added to generate a voltage signal corresponding the charge amount and output an amplified voltage signal (signal unit).

With this control, four-pixel addition for the most downstream second block BL2 among combinations of pixels shown in FIG. 7 can be performed. The output circuit 50 repetitively outputs a signal unit adding four sets of charges 5m, 6y, 7m and 8y and a signal unit adding four sets of charges 5g, 6c, 7g and 8c.

Four-pixel addition in the first and second blocks BL1 and BL2 is repeated in the above manner until all combinations of pixels shown in FIG. 7 are processed.

If the control method for the output circuit 50 is changed, four-pixel addition for pixel combinations different from those shown in FIG. 7 can be performed.

FIG. 9 shows another example of combinations of pixels to be subjected to four-pixel addition in a solid state image pick-up device 105 having the pixel layout same as that shown in FIG. 1, the pixel addition generating no white signal.

In FIG. 9, four pixel addition is performed by using a first pair of two pixels surrounded by a two-dot chain line and a second pair of two pixels connected by a two-dot chain line to the first pair. Pixel rows are classified into first and second blocks BL10 and BL11 depending upon colors of pixels to be subjected to four-pixel addition. Each of the first and second blocks BL10 and BL11 has four pixel rows disposed along the pixel column direction. The first and second blocks BL10 and BL11 are alternately disposed.

The first block BL10 is subjected to four-pixel addition of two green pixels G and two cyan pixels C and four-pixel addition of two magenta pixels M and two yellow pixels Y are performed.

The second block BL11 is subjected to four-pixel addition of two yellow pixels Y and two green pixels G and four-pixel addition of two cyan pixels C and two magenta pixels M.

Charges read from of pairs of two pixels of the first block BL10 are added and sequentially output from HCCD 40. A signal (signal unit) corresponding the charge amount is output. Next, charges read from pairs of two pixels of the second block BL11 are added and sequentially output from HCCD 40. A signal (signal unit) corresponding to the charge amount is output.

Figure 10:
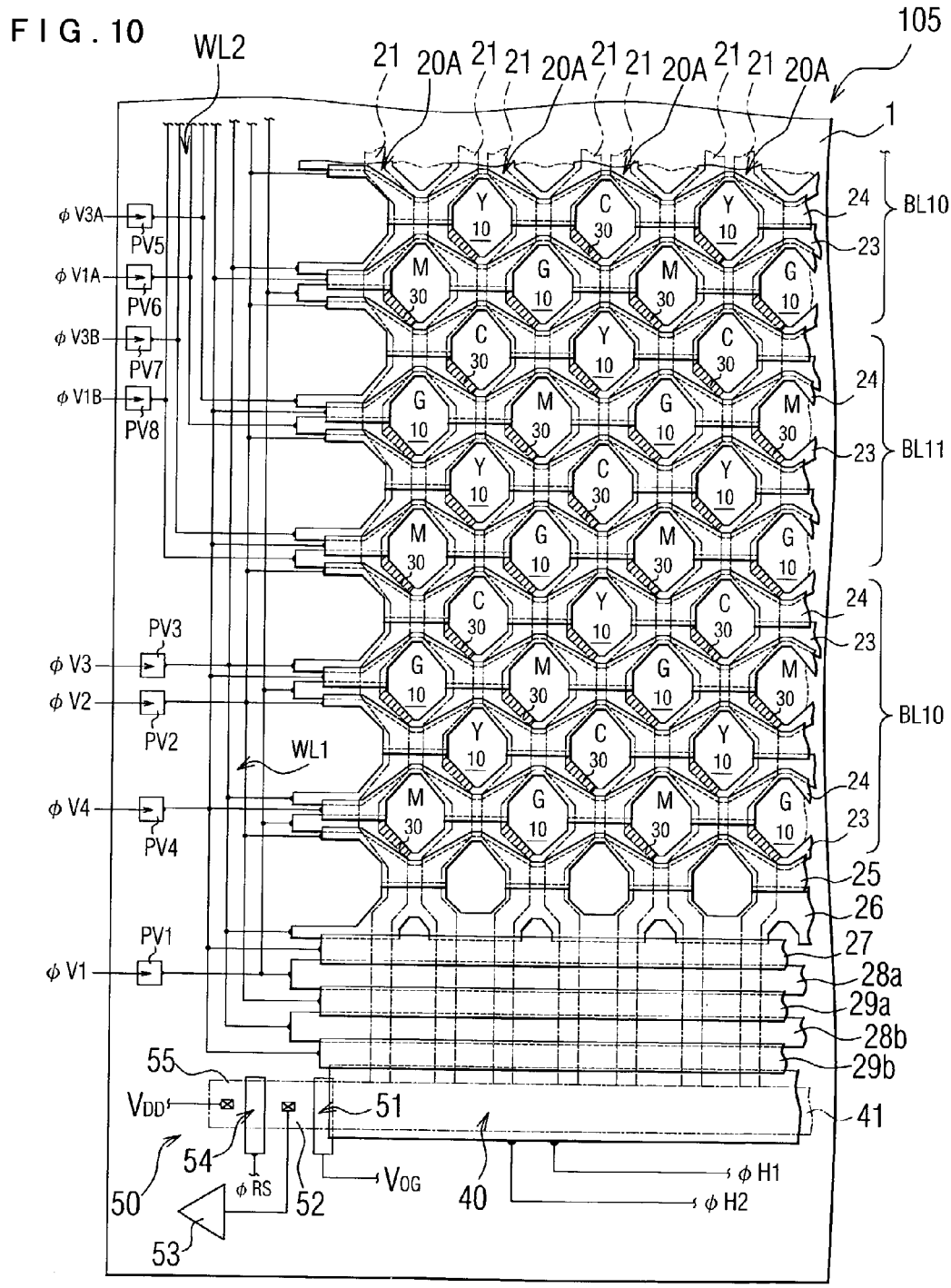
FIG. 10 is a schematic diagram briefly showing pixels, VCCD's, HCCD's and an output circuit of a solid state image pick-up device subjected to four-pixel addition.

FIG. 10 is a schematic diagram showing the layout of pixels 10, VCCD columns 20A, an HCCD row 40 and an output circuit 50 of a solid state image pick-up device 105 which performs four-pixel addition.

The VCCD column 20A has fourth to seventh auxiliary transfer electrodes 28a, 28b, 29a and 29b on the downstream side of a third auxiliary transfer electrode 27. Wiring lines for supplying a drive signal to each VCCD 20A are different from those shown in FIG. 4A.

In FIG. 10, components common to those shown in FIGS. 4A and 4B are represented by similar reference symbols and the description thereof is omitted.

For the pixels 10 in the first block BL10, four-phase drive signals φV1, φV2, φV3 and φV4 are applied to first and second vertical transfer electrodes 23 and 24 and first to seventh auxiliary transfer electrodes 25 to 27, 28a, 28b, 29a and 29b via pads PV1 to PV4 and wiring lines WL1.

A drive signal φV3A, φV1A, φV3B or φV1B is applied to the first vertical transfer electrode 23 for the pixels 10 in the second block BL11 via pads PV5 to PV8 and wiring lines WL2, and a drive signal φV2 or φV4 is applied to the second vertical transfer electrode 24 via the pad PV2 or PV4 and wiring lines WL1.

The drive signals φV1 φV1A and φV1B as well as the drive signals φV3, φV3A and φV3B have the same phase and waveform. A read pulse (e.g., 15 V) can be superposed upon these drive signals.

When charges are read from pixels 10 in the first block BL10 into corresponding HCCD's 20A, the read pulse is superposed upon the drive signals φV1 and φV3 at the same timing or slightly shifted timings.

When charges are read from pixels 10 in the two upstream pixel rows in the second block BL11 into corresponding HCCD's 20A, the read pulse is superposed upon the drive signals φV3A and φV1A at the same timing or slightly shifted timings. When charges are read from pixels 10 in the two downstream pixel rows in the second block BL11 into corresponding HCCD's 20A, the read pulse is superposed upon the drive signals φV3B and φV1B at the same timing or slightly shifted timings.

Each VCCD 20A is driven by the drive signals φV1 to φV4, φV1A, φV1B, φV3A and φV3B, and charges read from a pixel 10 are transferred toward a corresponding HCCD 40.

An image pick-up apparatus (digital still camera) similar to the image pick-up apparatus 200 shown in FIG. 6 can be realized by using the solid image pick-up device 105.

As described with reference to FIGS. 8A to 8I, the operations of VCCD's 20A, HCCD's 40 and output circuit 50 for four-pixel addition are quite different from those for two-pixel addition. Four-pixel addition cannot be performed even if the solid state image pick-up device 100 shown in FIG. 6 is replaced with the solid state image pick-up device 105.

The drive signal generator 120 shown in FIG. 6 is required to generate drive signals necessary for four-pixel addition. Namely, data necessary for four-pixel addition is stored in the memory of the timing signal generator 122. The structures of the timing signal generator 122 and driver 124 are changed to some extent.

One drive signal generator may be structured so that it can be used for both two-pixel addition and four-pixel addition. Similarly, one second color separator may be structured so that it can be used for both two-pixel addition and four-pixel addition. It is also possible to structure one image pick-up apparatus usable for individual pixel read, two-pixel addition and four-pixel addition.

Next, an image pick-up apparatus (digital still camera) according to a second embodiment will be described.

Figure 11:
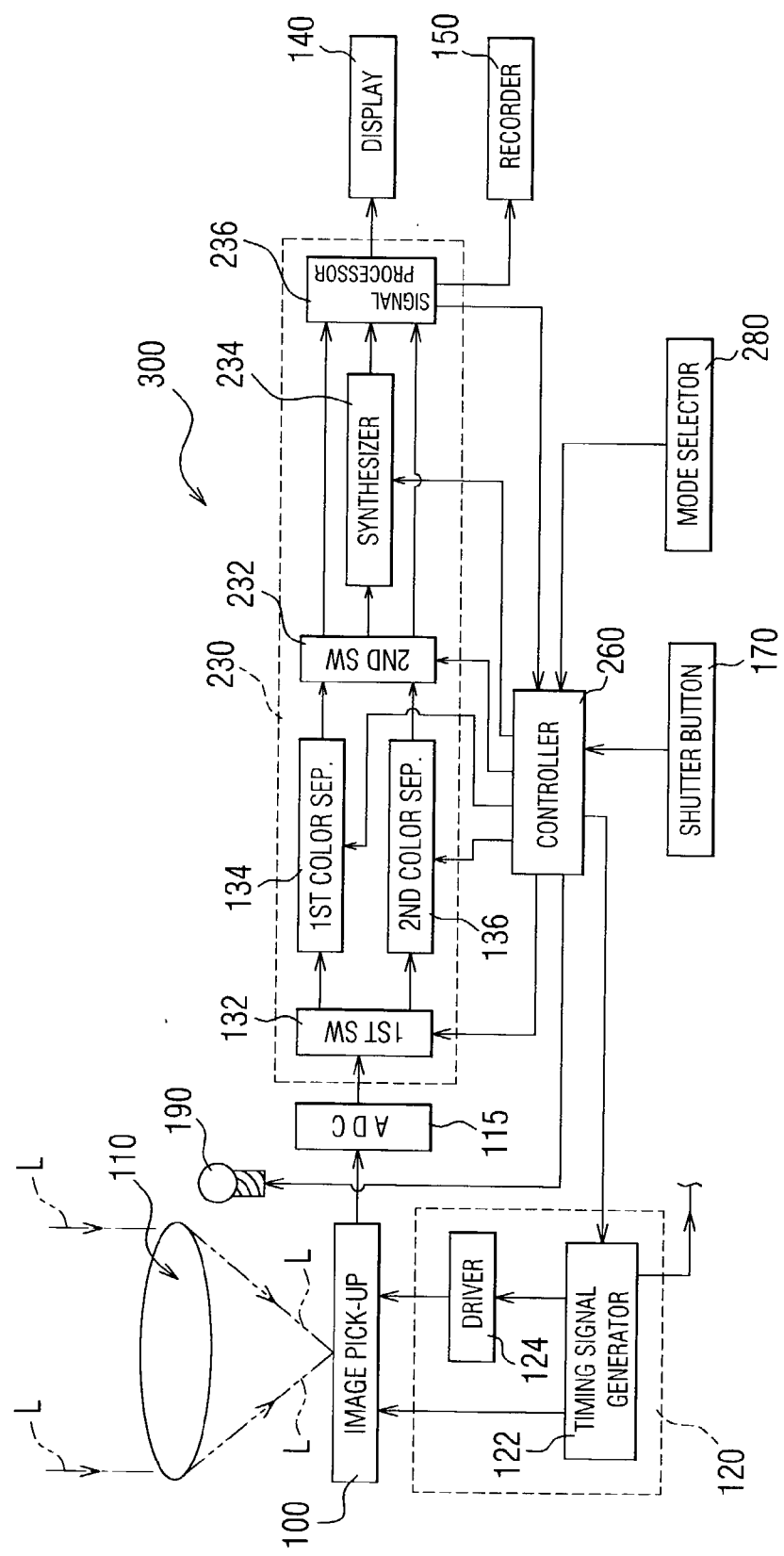
FIG. 11 is a block diagram schematically showing the structure of an image pick-up apparatus according to a second embodiment.

FIG. 11 is a block diagram showing the structure of the image pick-up apparatus (digital still camera) of the second embodiment. The image pick-up apparatus 300 has an image signal generator 230 having the structure and function different from those of the image signal generator 130 shown in FIG. 6, and has a controller 260 having functions in addition to the functions of the controller 160 shown in FIG. 6. The image pick-up apparatus has a mode selector 280 for selecting an operation mode from operation modes larger in number than the operation modes selectable by the mode selector 180 shown in FIG. 6.

In FIG. 11, components common to those shown in FIG. 6 are represented by similar reference numerals, and the description thereof is omitted.

The image signal generator 230 of the image pick-up apparatus 300 has a synthesizer 234. The synthesizer 234 synthesizes a signal output from the first color separator 134 during the individual pixel read operation and a signal output from the second color separator 136 during the pixel addition read operation, and generates color signals, a luminance signal and the like necessary for generating an image signal.

A signal output from the first color separator 134 and a signal output from the second color separator 136 are directed either to the synthesizer 234 or signal processor 236 by a second switching (SW) element 232.

The signal processor 236 generates an image signal by using any one of a signal output from the first color separator 134, a signal output from the second color separator 136, and a signal output from the synthesizer 234.

The controller 260 has a function of controlling the second SW element 232 and synthesizer 234 in addition to the functions of the controller 160 shown in FIG. 6.

The image pick-up apparatus 300 operates in one of a high image quality mode during the individual pixel read operation, a high sensitivity mode during the pixel addition read operation, and an image synthesizing mode during the synthesizing operation by the synthesizer 232. One of the modes is selected by a user with the mode selector 280. The number of operation modes selectable by the mode selector is larger by one than the operation modes of the image pick-up apparatus 200 shown in FIG. 6.

Similar to the image pick-up apparatus 200, the image pick-up apparatus 300 may be provided with an automatic image pick-up mode. In the automatic image pick-up mode, the controller 260 determines the operation mode to be selected from the high image quality mode, high sensitivity mode, and image synthesizing mode.

FIG. 12 shows the operation timings of the first color separator 132 and second color separator 134 when a still image is picked up by using the electronic flash 190 in the image synthesizing mode. It is assumed that the first color separator 132 performs the individual pixel read operation before the image synthesizing mode starts.

When the shutter button 170 is depressed in the image synthesizing mode selected by the mode selector 280, the solid state image pick-up device 105 sequentially performs an operation necessary for generating signal units of one frame through pixel addition read and an operation necessary for generating signal units of one frame through individual pixel read, in this order recited. It is assumed that the shutter bottom 170 is depressed at a predetermined timing between $T_1$ and $T_2$ when blanking pulses VD1 and VD2 are generated.

The second color separator 134 receives the signal units generated by pixel addition read in the image synthesizing mode, and operates during the period between predetermined timings $T_2$ and $T_5$ when blanking pulses VD2 and VD3 are generated. The electronic flash emits light during the period between timings $T_3$ and $T_4$. This light emission is performed before individual pixel read in the image synthesizing mode starts.

Next, the first color separator 132 receives the signal units and operates during the period between predetermined timings $T_5$ and $T_6$ when blanking pulses VD3 and VD4 are generated.

The synthesizer 234 performs a synthesizing operation and the signal processor 236 generates image signals. A reproduced image of image signals has, for example, a subject background image formed by pixel addition read and a subject image formed by individual pixel read.

Even if the subject and background have dark scenes, an image having both bright subject and background images can be reproduced.

The present invention has been described in connection with the preferred embodiments. The invention is not limited only to the above embodiments. It is apparent that various modifications, improvements, combinations, and the like can be made by those skilled in the art.

For example, the layout of pixels for two-pixel addition is not limited only to that shown in FIG. 1. In FIG. 1, green pixels G and magenta pixels M may be exchanged or yellow pixels Y and cyan pixels C may be exchanged. Desired two-pixel addition is possible without generating a white signal, even if most downstream one or two pixel rows shown in FIG. 1 are neglected or left side one or two pixel columns are neglected.

Such modifications are also possible for four-pixel addition.

If charges of two pixels are added in HCCD's as shown in FIGS. 8F and 8I, the signal units can be generated without pixel addition in the output circuit. Desired two-pixel addition is possible without generating a white signal.

In a CCD type solid image pick-up device used as an area image sensor, a light shielding film is used for avoiding unnecessary photoelectric conversion in the area other than the pixel areas. If necessary, a micro lens is formed above each color filter.

Figure 13:
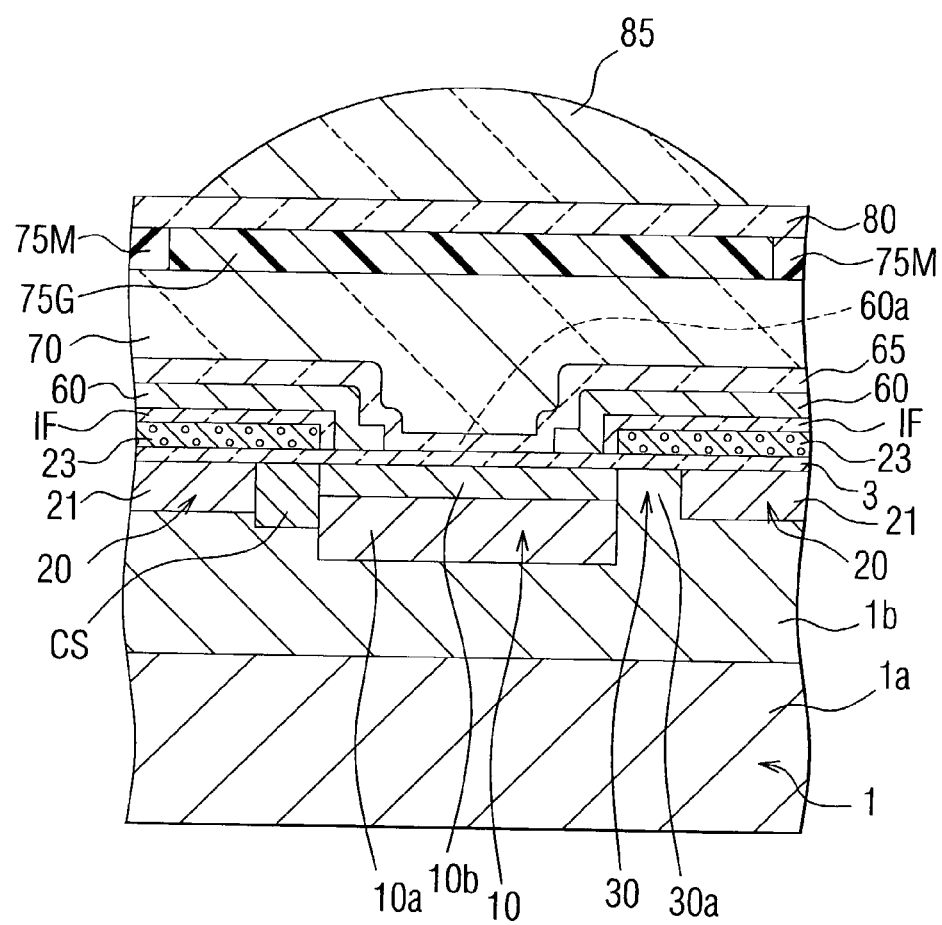
FIG. 13 is a schematic cross sectional view of one pixel and its nearby area of the solid state image pick-up device shown in FIG. 1.

FIG. 13 is a cross sectional view showing one pixel and its nearby area of the solid state image pick-up device 100 shown in FIG. 1. In FIG. 13, components common to those shown in FIG. 4B are represented by similar reference numerals and symbols, and the description thereof is omitted.

As shown in FIG. 13, a pixel 10 is a buried type photodiode formed by an n-type impurity diffusion region 10a in a predetermined area of a p-type impurity diffusion region 1b and a $p^+$-type impurity diffusion region 10b formed on the n-type impurity diffusion region 10a. The n-type impurity diffusion region 10a functions as a charge accumulation region.

The p-type impurity diffusion region 1b extends along the right side of each pixel (n-type impurity diffusion region 10a) as viewed in FIG. 13. This extended p-type impurity diffusion region 1b is used as a channel region 30a of the read gate 30. The channel region 30a is disposed between the vertical charge transfer channel 21 and corresponding pixel 10.

The electrically insulating film 3 may be a single layer silicon oxide film, a lamination film of a silicon oxide film and a silicon nitride film, or the like.

On the surface of the first polysilicon vertical transfer electrode 23, the electrically insulating film IF such as a thermally oxidized film is formed. Although not shown in FIG. 13, the electrically insulating film is also formed on the surfaces of the second polysilicon vertical transfer electrode 24 and auxiliary transfer electrodes.

A channel stop region CS surrounds as viewed in plan the outer peripheries of each pixel 10, each vertical charge transfer channel 21 and horizontal charge transfer channel 41 (refer to FIG. 4B), excepting the area where the channel region 30a is formed. For example, the channel stop region CS is made of a $p^+$-type impurity diffusion region formed in a predetermined area of the p-type impurity diffusion region 1b.

Each impurity diffusion region can be formed, for example, by ion implantation followed by annealing. The p-type impurity diffusion region 1b can be formed, for example, by epitaxial growth.

A light shielding film 60 is formed covering VCCD's 20, HCCD's 40 and output circuit 50 (refer to FIGS. 4A and 4B). The light shielding film 60 has an opening 60a above each pixel 10. The surface area of each pixel 10 as viewed in plan through the opening 60a is a light incidence plane of the pixel 10.

The light shielding film 60 is made of, for example, metal material such as aluminum, chromium, tungsten, titanium and molybdenum, or alloy material of two or more of these metal materials. For example, the light shielding film 60 is made of a W single layer.

A passivation film 65 covers the light shielding film 60 and the electrically insulating film 3 exposed in the opening 60a to protect the underlying layers. For example, the passivation film 65 is made of silicon nitride, silicon oxide or the like.

A first planarizing film 70 covers the passivation film 65. The first planarizing film 70 can be used also as a focus adjusting layer for a micro lens 85 to be later described. If necessary, an inner lens is formed in the first planarizing film 70.

The first planarizing film 70 is formed, for example, by spin-coating transparent resin such as photoresist to a desired thickness.

A color filer 75 is formed on the first planarizing film 70 above each pixel 10. In FIG. 13, one green filter 75G and two magenta filters 75M are shown.

A color filter can be formed, for example, by forming a resin (color resin) layer containing desired pigment or dye in a predetermined area by photolithography or the like.

A second planarizing film 80 is formed on the color filters and provides a planarized surface on which micro lenses 85 are formed. The second planarizing film 80 is formed, for example, by spin-coating transparent resin such as photoresist to a desired thickness.

Micro lenses 85 are formed on the second planarizing film 82. The micro lens 85 is formed above each pixel 10. For example, the micro lens 85 is formed in the following manner. A transparent resin such as photoresist having a refractive index of about 1.3 to 2.0 is formed in each predetermined block by photolithography or the like. The transparent resin layer in each block is melted by a heat treatment to round corners by the surface tension and change the shape to a shape with a minimum free energy. Thereafter, the resin layer is cooled to obtain a micro lens. A micro lens 85 is formed in each block.

What we claim are:

1. An image pick-up apparatus comprising:
   a number of pixels disposed in a honeycomb configuration, and a signal unit generator for reading and detecting charges accumulated in each pixel and generating a signal to be unit used for generating an image signal, wherein:
   the configuration of the number of pixels includes an alternate repetitive configuration of a pixel row having green and magenta pixels alternately and repetitively disposed and a pixel row having cyan and yellow pixels alternately and repetitively disposed; and
   said signal unit generator can selectively perform either (i) an individual pixel read operation of individually detecting charges accumulated in each pixel and generating a signal unit or (ii) a pixel addition read operation of detecting charges which are an addition of charges accumulated in the green pixel and charges accumulated in the cyan or yellow pixel and generating a signal unit, and also detecting charges which are an addition of charges accumulated in the magenta pixel and charges accumulated in the yellow or cyan pixel and generating a signal unit.

2. An image pick-up apparatus according to claim 1, wherein said signal unit generator can detect charges accumulated in two pixels through two-pixel addition and generate the signal unit by the pixel addition read operation.

3. An image pick-up apparatus according to claim 2, wherein said signal unit generator comprises (i) vertical charge transfer devices disposed in correspondence with each pixel column for reading charges accumulated in corresponding pixels and transferring the charges along a predetermined direction, (ii) horizontal charge transfer devices for receiving charges output from the vertical charge transfer devices and sequentially transferring the charges, and (iii) an output circuit for receiving the charges from the horizontal charge transfer device and generating the signal unit.

4. An image pick-up apparatus according to claim 3, wherein said output circuit of said signal unit generator can add charges accumulated in two pixels by the pixel addition read operation.

5. An image pick-up apparatus according to claim 3, wherein said signal unit generator can add charges accumulated in two pixels in said horizontal charge transfer devices by the pixel addition read operation.

6. An image pick-up apparatus according to claim 3, further comprising:
   a first color separator capable of performing a color separation operation in accordance with the signal unit generated by said signal unit generator by the individual pixel read operation;
   a second color separator capable of performing a color separation operation in accordance with the signal unit generated by said signal unit generator by the pixel addition read operation; and
   a signal processor capable of generating an image signal in accordance with an output signal from said first or second color separator.

7. An image pick-up apparatus according to claim 6, further comprising:
   a synthesizer capable of synthesizing an output signal from said first color separator and an output signal from said second color separator and generating signals necessary for generating image signals of one frame, wherein
   said signal processor can generate an image signal in accordance with an output signal from any one of said first color separator, said second color separator and said synthesizer.

8. An image pick-up apparatus according to claim 1, wherein said signal unit generator can detect charges accumulated in four pixels through four-pixel addition and generate the signal unit by the pixel addition read operation.

9. An image pick-up apparatus according to claim 8, wherein said signal unit generator comprises (i) vertical charge transfer devices disposed in correspondence with each pixel column for reading charges accumulated in corresponding pixels and transferring the charges along a predetermined direction, (ii) horizontal charge transfer devices for receiving charges output from the vertical charge transfer devices and sequentially transferring the charges, and (iii) an output circuit for receiving the charges from the horizontal charge transfer device and generating the signal unit.

10. An image pick-up apparatus according to claim 9, wherein said output circuit of said signal unit generator can add charges accumulated in two pixels by the pixel addition read operation.

11. An image pick-up apparatus according to claim 10, wherein said signal unit generator can add two sets of charges supplied from said horizontal charge transfer device during the pixel addition read operation.

12. An image pick-up apparatus according to claim 8, further comprising:
    a first color separator capable of performing a color separation operation in accordance with the signal unit generated by said signal unit generator by the individual pixel read operation;
    a second color separator capable of performing a color separation operation in accordance with the signal unit generated by said signal unit generator by the pixel addition read operation; and
    a signal processor capable of generating an image signal in accordance with an output signal from said first or second color separator.

13. An image pick-up apparatus according to claim 12, further comprising:
    a synthesizer capable of synthesizing an output signal from said first color separator and an output signal from said second color separator and generating signals necessary for generating image signals of one frame, wherein
    said signal processor can generate an image signal in accordance with an output signal from any one of said first color separator, said second color separator and said synthesizer.

14. A driving method for an image pick-up apparatus having a number of pixels disposed in a honeycomb configuration, and a signal unit generator for reading and detecting charges accumulated in each pixel and generating a signal unit to be used for generating an image signal, wherein the configuration of the number of pixels includes an alternate repetitive configuration of a pixel row having green and magenta pixels alternately and repetitively disposed and a pixel row having cyan and yellow pixels alternately and repetitively disposed, the method comprising:
- a step of applying light to each pixel to accumulate charges in the pixel; and
- a step of making the signal unit generator generate the signal unit by making the signal unit generator perform either (i) an individual pixel read operation of individually detecting charges accumulated in each pixel and generating a signal unit or (ii) a pixel addition read operation of detecting charges which are an addition of charges accumulated in the green pixel and charges accumulated in the cyan or yellow pixel and generating a signal unit, and also detecting charges which are an addition of charges accumulated in the magenta pixel and charges accumulated in the yellow or cyan pixel and generating a signal unit.

15. A driving method according to claim 14, wherein the signal unit generator can detect charges accumulated in two pixels through two-pixel addition and generate the signal unit by the pixel addition read operation.

16. A driving method according to claim 15, wherein the output circuit of the signal unit generator can add charges accumulated in two pixels by the pixel addition read operation.

17. A driving method according to claim 15, wherein the signal unit generator can add charges accumulated in two pixels in said horizontal charge transfer devices by the pixel addition read operation.

18. A driving method according to claim 15, wherein the image pick-up apparatus further comprises:
- a first color separator capable of performing a color separation operation in accordance with the signal unit generated by the signal unit generator by the individual pixel read operation;
- a second color separator capable of performing a color separation operation in accordance with the signal unit generated by the signal unit generator by the pixel addition read operation; and
- a signal processor capable of generating an image signal in accordance with an output signal from the first or second color separator.

19. A driving method according to claim 15, wherein the image pick-up apparatus further comprises:
- a synthesizer capable of synthesizing an output signal from the first color separator and an output signal from the second color separator and generating signals necessary for generating image signals of one frame, wherein
- the signal processor can generate an image signal in accordance with an output signal from any one of the first color separator, second color separator and synthesizer.

20. A driving method according to claim 14, wherein the signal unit generator can detect charges accumulated in four pixels through four-pixel addition and generate the signal unit by the pixel addition read operation.

21. A driving method according to claim 20, wherein the output circuit of the signal unit generator can add charges accumulated in two pixels by the pixel addition read operation.

22. A driving method according to claim 20, wherein the signal unit generator can add two sets of charges supplied from the horizontal charge transfer device during the pixel addition read operation.

23. A driving method according to claim 20, wherein the image pick-up apparatus further comprises:
- a first color separator capable of performing a color separation operation in accordance with the signal unit generated by the signal unit generator by the individual pixel read operation;
- a second color separator capable of performing a color separation operation in accordance with the signal unit generated by the signal unit generator by the pixel addition read operation; and
- a signal processor capable of generating an image signal in accordance with an output signal from the first or second color separator.

24. A driving method according to claim 20, wherein the image pick-up apparatus further comprises:
- a synthesizer capable of synthesizing an output signal from the first color separator and an output signal from the second color separator and generating signals necessary for generating image signals of one frame, wherein
- the signal processor can generate an image signal in accordance with an output signal from any one of the first color separator, second color separator and synthesizer.

25. A driving method according to claim 14, further comprising a step of generating an image signal in accordance with the signal unit.

26. A driving method according to claim 25, wherein:
- in said step of generating the signal unit, the pixel addition read operation and the individual pixel read operation are performed in succession; and
- in said step of generating the image signal, the image signal is generated in accordance with the signal unit generated by the pixel addition read operation and the signal unit generated by the individual pixel read operation.

* * * * *